United States Patent (10) Patent No.: US 11,457,143 B2
Seta (45) Date of Patent: Sep. 27, 2022

(54) SENSOR DEVICE, ELECTRONIC DEVICE, SENSOR SYSTEM AND CONTROL METHOD

(71) Applicant: Sony Semiconductor Solutions Corporation, Kanagawa (JP)

(72) Inventor: Shoji Seta, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 104 days.

(21) Appl. No.: 16/964,683

(22) PCT Filed: Oct. 23, 2019

(86) PCT No.: PCT/JP2019/041441
§ 371 (c)(1),
(2) Date: Jul. 24, 2020

(87) PCT Pub. No.: WO2020/116046
PCT Pub. Date: Jun. 11, 2020

(65) Prior Publication Data
US 2020/0351440 A1 Nov. 5, 2020

(30) Foreign Application Priority Data
Dec. 7, 2018 (JP) .............................. JP2018-230398

(51) Int. Cl.
*H04N 5/232* (2006.01)
(52) U.S. Cl.
CPC ............................... *H04N 5/23227* (2018.08)

(58) Field of Classification Search
CPC . H04N 5/23241; H04N 5/907; G06F 13/4068
See application file for complete search history.

(56) References Cited

U.S. PATENT DOCUMENTS

| 10,165,169 | B2* | 12/2018 | Jung | H04N 5/2257 |
|---|---|---|---|---|
| 2016/0356632 | A1* | 12/2016 | Madabushi | G01D 18/002 |
| 2018/0370502 | A1* | 12/2018 | Wang | G08G 1/163 |

FOREIGN PATENT DOCUMENTS

| JP | 2000-235644 A | 8/2000 |
| JP | 2005-035396 A | 2/2005 |
| JP | 2017-191566 A | 10/2017 |
| JP | 2018-026682 A | 2/2018 |
| WO | 2019/116985 A1 | 6/2019 |

* cited by examiner

*Primary Examiner* — Lin Ye
*Assistant Examiner* — Fayez A Bhuiyan
(74) *Attorney, Agent, or Firm* — Michael Best & Friedrich LLP

(57) ABSTRACT

A sensor device according to an embodiment obtains accurate information even when there is deterioration in the sensor. The sensor device includes a sensor (11) that obtains sensor information; an FPGA (Field-Programmable Gate Array) (12) that performs predetermined processing on the sensor information obtained by the sensor; and a memory (15) that is used to store data, which is to be used in making the FPGA perform the predetermined processing.

18 Claims, 30 Drawing Sheets

FIG.9

| | | SENSOR | MODULE | MODIFICATION OF SETTING DATA | MODIFICATION OF CIRCUIT DATA |
|---|---|---|---|---|---|
| BASE AREA | BLACK LEVEL PROCESSING | ○ | | MODIFICATION OF OPTICAL BLACK (OB) VALUE | - |
| | DEFECT CORRECTION | ○ | ○ | ADDITION OF DEFECT CORRECTION VALUE | · MODIFICATION OF CORRECTION CIRCUIT EQUAL TO OR GREATER THAN CLUSTER<br>· MODIFICATION OF SHIMMY IMPROVEMENT CIRCUIT |
| | SHADING CORRECTION | | ○ | MODIFICATION OF SHADING CORRECTION VALUE | MODIFICATION OF SHADING ALGORITHM (MODIFICATION OF SHADING CURVE FUNCTION) |
| | DISTORTION CORRECTION | | ○ | - | ADDITION OF DISTORTION CORRECTION CIRCUIT (FOR PIN-CUSHION DISTORTION, BARREL DISTORTION) |
| CONTROL AREA | CONTROL SYSTEM CORRECTION | | ○ | MODIFICATION OF AF, OIS, AND CALIBRATION DATA | GENERATION OF DRIVER CONTROL ADJUSTMENT FORWARD CIRCUIT (SERVO ADJUSTMENT, WHOLE GAIN ADJUSTMENT, OPTICAL AXIS ADJUSTMENT) |
| | AE/AF/AWB | ○ | | - | MODIFICATION OF AE/AWB ALGORITHM |
| | SYNCHRONIZATION | ○ | | MODIFICATION OF INTERPOLATION CORRECTION VALUE | MODIFICATION OF INTERPOLATION ALGORITHM |
| | LINEAR MATRIX PROCESSING | ○ | | MODIFICATION OF DISPERSION CORRECTION VALUE | MODIFICATION OF EQUALITY FUNCTION ALGORITHM |
| | GAMMA CORRECTION | ○ | | MODIFICATION OF GAMMA CORRECTION VALUE (CONTRAST) | - |
| PICTURE FORMATION AREA | LUMINANCE-COLOR SEPARATION | ○ | | - | - |
| | EDGE REINFORCEMENT | ○ | | MODIFICATION OF CONTOUR (APERTURE) CORRECTION/ NOISE CORRECTION VALUE | MODIFICATION OF CONTOUR (APERTURE) CORRECTION/ NOISE CORRECTION ALGORITHM |
| | COLOR DIFFERENCE MATRIX PROCESSING | ○ | | MODIFICATION OF COLOR MATRIX VALUE | - |
| | RESIZING/ZOOMING | | ○ | MODIFICATION OF ZOOMING VALUE | - |
| | OUTPUT I/F PROCESSING | | | MODIFICATION OF MODE-BASED OUTPUT LANE | - |

FIG.12

| Instr. No. | 1 | 2 | 3 | 4 | 5 | 6 | ... | 499 | 500 | 501 | 502 | 503 | 504 | 505 | 506 | ... | 999 | 1000 |
|---|---|---|---|---|---|---|---|---|---|---|---|---|---|---|---|---|---|---|
| 1 | ▨ | | | | | | ... | | | | | | | | | ... | | |
| 2 | | ▨ | | | | | ... | | | | | | | | | ... | | |
| 3 | | | ▨ | ▨ | | | ... | | | | | | | | | ... | | |
| ... | : | : | : | : | : | : | ... | : | : | : | : | : | : | : | : | ... | : | : |
| 499 | | | | | | | ... | | ▨ | | | | | | | ... | | |
| 500 | | | | | | | ... | | ▨ | ▨ | | | | | | ... | | |
| 501 | | | | | | | ... | | | ▨ | ▨ | ▨ | | | | ... | | |
| 502 | | | | | | | ... | | | | ▨ | ▨ | ▨ | ▨ | | ... | | |
| 503 | | | | | | | ... | | | | | ▨ | ▨ | ▨ | | ... | | |
| ... | : | : | : | : | : | : | ... | : | : | : | : | : | : | : | : | ... | : | : |
| 999 | | | | | | | ... | | | | | | | | | ... | ▨ | |
| 1000 | | | | | | | ... | | | | | | | | | ... | | ▨ |

FIG.15

| Instr. No. | 1 | 2 | 3 | 4 | 5 | 6 | ... | 499 | 500 |
|---|---|---|---|---|---|---|---|---|---|
| 1 | ▨ | ▨ | ▨ | ▨ | ▨ |  | ... |  |  |
| 2 |  | ▨ | ▨ | ▨ | ▨ | ▨ | ... |  |  |
| 3 |  |  | ▨ | ▨ | ▨ | ▨ | ... |  |  |
| ⋮ | ⋮ | ⋮ | ⋮ | ⋮ | ⋮ | ⋮ | ... | ⋮ | ⋮ |
| 499 |  |  |  |  |  |  | ... | ▨ |  |
| 500 |  |  |  |  |  |  | ... | ▨ | ▨ |
| 501 | ▨ | ▨ | ▨ | ▨ | ▨ | ▨ | ... |  |  |
| 502 |  | ▨ | ▨ | ▨ | ▨ | ▨ | ... |  |  |
| 503 |  |  | ▨ | ▨ | ▨ | ▨ | ... |  |  |
| ⋮ | ⋮ | ⋮ | ⋮ | ⋮ | ⋮ | ⋮ | ... | ⋮ | ⋮ |
| 999 |  |  |  |  |  |  | ... | ▨ |  |
| 1000 |  |  |  |  |  |  | ... |  | ▨ |

SENSOR DEVICE, ELECTRONIC DEVICE, SENSOR SYSTEM AND CONTROL METHOD

FIELD

The application concerned is related to a sensor device, an electronic device, a sensor system, and a control method.

BACKGROUND

In recent years, since the IoT (Internet of Things) has become widespread in the society; the "things" such as sensors and devices exchange information by establishing connection with clouds, fogs, and servers via the Internet, thereby making it increasingly popular to develop systems for performing mutual control among the "things". Moreover, there has been active development of systems in which various services are provided to the users by utilizing the big data collected from the IoT.

CITATION LIST

Patent Literature

Patent Literature 1: JP 2000-235644 A
Patent Literature 2: JP 2018-26682 A

SUMMARY

Technical Problem

However, not just in the case of the IoT but also in the case of obtaining information using sensors of cameras and the like, there arises the issue that the deterioration of sensors due to usage and aging leads to inability to collect accurate information.

In that regard, in the application concerned, a sensor device, an electronic device, a sensor system, and a control method are proposed that enable obtaining accurate information even when there is deterioration of sensors.

Solution to Problem

To solve the problem described above, a sensor device includes: a sensor that obtains sensor information; an FPGA (Field-Programmable Gate Array) that performs predetermined processing on the sensor information obtained by the sensor; and a memory that is used to store data, which is to be used in making the FPGA perform the predetermined processing.

BRIEF DESCRIPTION OF DRAWINGS

FIG. 9 is a diagram illustrating an example of items for modification according to the first embodiment.

FIG. 12 is a diagram illustrating the clock cycle count required at the time of processing 1000 sets of data in the device configuration illustrated in FIG. 10.

FIG. 15 is a diagram illustrating the clock cycle count required at the time of processing 1000 sets of data in the image sensor according to the first embodiment.

DESCRIPTION OF EMBODIMENTS

Figure 1:
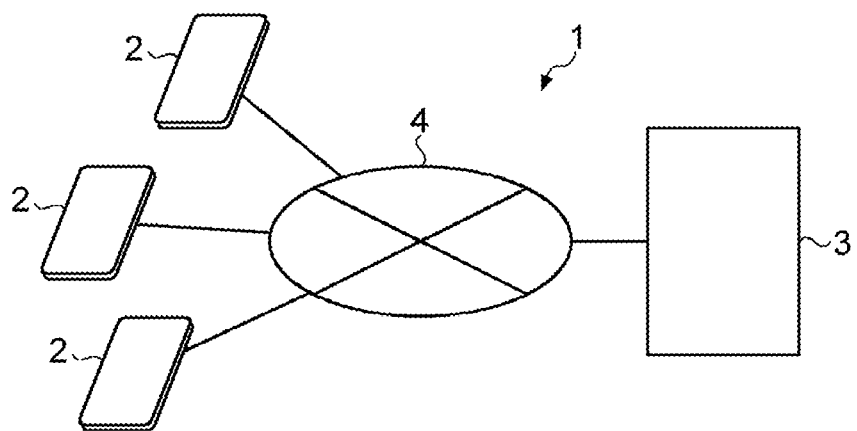
FIG. 1 is a schematic diagram illustrating an exemplary schematic configuration of a sensor system 1 according to a first embodiment.

Preferred embodiments of the application concerned are described below in detail with reference to the accompanying drawings. In the embodiments described below, the same constituent elements are referred to by the same reference numerals, and their explanation is not given repeatedly.

The explanation of the application concerned is given in the following order of items.
1. To begin with
2. First Embodiment
    2.1 System configuration
    2.2 Device configuration
    2.3 Stack structure
    2.4 Operations of image sensor
    2.5 Relationship between each operation and chips
    2.6 Correction of deterioration in image sensor
    2.7 Sequence of deterioration correction
    2.8 Analysis (machine learning) of image data
    2.9 Operation flow
        2.9.1 Operations in communication device
        2.9.2 Operations in server
    2.10 Modification in setting data/circuit data
    2.11 Method of high-speed processing
    2.12 Actions/effects
3. Second Embodiment
    3.1 Device configuration
    3.2 Chip configuration
    3.3 Actions/effects
4. Third Embodiment
    4.1 Device configuration
    4.2 Chip configuration
    4.3 Actions/effects
5. Fourth Embodiment
    5.1 Device configuration
    5.2 Chip configuration
    5.3 Actions/effects
6. Fifth Embodiment
    6.1 Device configuration
    6.2 Chip configuration
    6.3 Actions/effects
7. Sixth Embodiment
    7.1 Device configuration
    7.2 Modification example of device configuration
    7.3 Actions/effects
8. Seventh Embodiment
    8.1 Device configuration
    8.2 DNN analysis operation
    8.3 Operation flow
    8.4 Actions/effects
9. Eighth Embodiment
10. Application examples 1. To Begin With At present, as the devices in which sensors such as camera modules are installed, for example, there are various devices including wearable terminals such as smartphones and cellular phones; fixed imaging devices such as fixed-point cameras and monitoring cameras; mobile devices such as drones, automobiles, domestic robots, factory automation (FA) robots, monitoring robots, and autonomous robots; and medical equipment. In such devices, due to an increase in the usage frequency and the age, the cameras undergo aging deterioration. For example, the following issues may arise due to aging deterioration of cameras.

Firstly, accompanying the deterioration of a camera, the image quality and the control needs to be adjusted by modifying the setting values using a personal computer. For that, it requires time and efforts to send the camera to the manufacturer for repairs.

Secondly, although the image quality and the control can be modified by updating the software installed in the device, since there are individual differences among the devices regarding the changes in the image quality and the control, it is a difficult task to cover the adjustment of individual devices in the software updates.

Thirdly, regarding the devices such as automobiles, drones, and various types of robots that analyze the image data in real time and perform autonomous movements based on the result of analysis, in case of deterioration of the image quality or in case of trouble in the control adjustment, the setting values need to be corrected in real time.

Fourthly, in the medical field, for example, if there is deterioration in the cameras of a capsule endoscope, re-examination becomes necessary, thereby causing an increased burden on the patients from the perspective of physical strength and cost.

Fifthly, if the image quality and the control needs to be adjusted in the device itself, then either an adjustment system needs to be installed in the device or the device needs to be connected to an external system. That results in an increase in the size of the overall system configuration, thereby causing an increase in the cost, the footprint, and the weight.

Sixthly, in a device that is required to perform image analysis in real time, the operations at each stage are performed in a sequential manner. However, in that case, since the memory is shared across the stages; for example, if interrupt processing is instructed, the processing time becomes enormously long.

In that regard, in the embodiments described below, the explanation with reference to examples is given about a sensor device, an electronic device, a sensor system, and a control method that enable obtaining accurate information even when there is deterioration of sensors, such as cameras, due to usage and aging.

2. First Embodiment

A first embodiment is described below in detail with reference to the accompanying drawings. In the first embodiment, it is assumed that an image sensor is the target sensor for deterioration correction, and that a communication device has the image sensor installed therein. However, the sensor is not limited to an image sensor, and it is possible to use various types of sensors such as a temperature sensor, a humidity sensor, or a radiation dosimeter.

2.1 System Configuration

FIG. 1 is a schematic diagram illustrating an exemplary schematic configuration of a sensor system 1 according to the first embodiment. As illustrated in FIG. 1, in the sensor system 1, one or more communication devices 2 having the communication function are connected to a server 3 via a network 4.

The communication devices 2 are equipped with the imaging function, in addition to having the abovementioned communication function for communicating with the server 3 via the network 4. As far as the communication devices 2 are concerned, it is possible to use various types of devices having the sensing function and the communication function, such as wearable terminals such as smartphones and cellular phones; fixed imaging devices such as fixed-point cameras and monitoring cameras; mobile devices such as drones, automobiles, domestic robots, factory automation (FA) robots, monitoring robots, and autonomous robots; and medical equipment.

The server 3 can be, for example, a cloud server or a fog server connected to a network. As the network 4, for example, it is possible to use various types of networks such as the Internet, a LAN (Local Area Network), a mobile communication network, and a public line network.

2.2 Device Configuration

Figure 2:
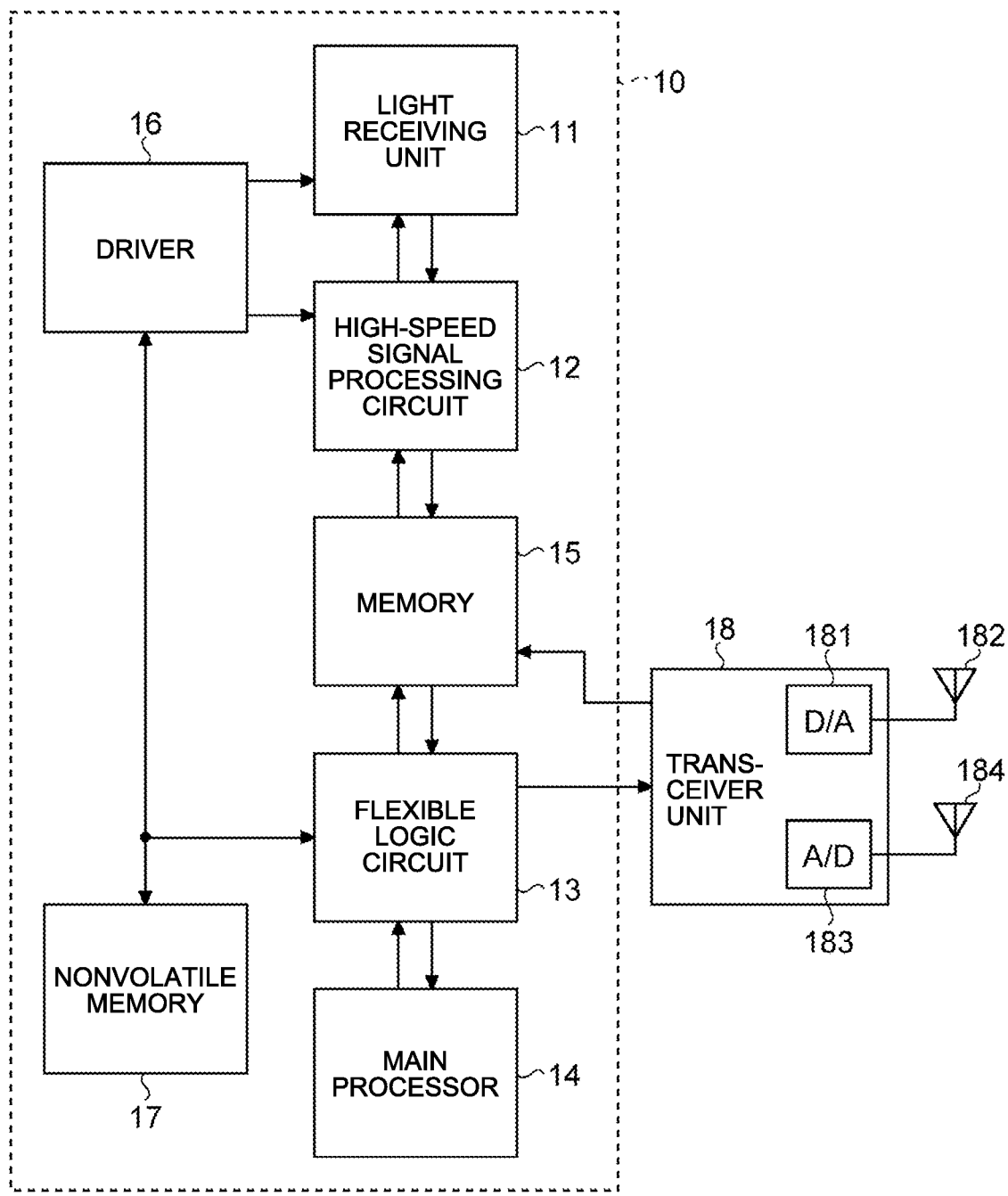
FIG. 2 is a block diagram illustrating an exemplary schematic configuration of a communication device representing an electronic device according to the first embodiment.

FIG. 2 is a block diagram illustrating an exemplary schematic configuration of a communication device representing an electronic device according to the first embodiment. As illustrated in FIG. 2, the communication device 2 includes, for example, an image sensor 10 representing a fixed imaging device, and a transceiver unit 18. The image sensor 10 includes, for example, a light receiving unit 11, a high-speed signal processing circuit 12, a flexible logic circuit 13, a main processor 14, a memory 15, a driver 16, and a nonvolatile memory 17.

The light receiving unit 11 includes, for example, an optical sensor array (also called a pixel array) in which photoelectric conversion elements such as photodiodes are arranged in the row direction and the column direction as a two-dimensional matrix; an optical system such as lenses installed on the light receiving surface of the optical sensor array; and an actuator that drives the optical system.

The high-speed signal processing circuit 12 includes an analog circuit such as an ADC for converting analog pixel signals, which are read from the photoelectric conversion elements of the light receiving unit 11, into digital pixel signals; and a logic circuit for performing digital processing such as CDS (Correlated Double Sampling) based on the pixel signals converted into digital values by the ADC.

The memory 15 is used to store the digital image data output from the high-speed signal processing circuit 12. Moreover, the memory 15 is used to store the image data that has been subjected to predetermined processing in the flexible logic circuit 13 and the main processor 14 (described later). Furthermore, the memory 15 is used to store a variety of data to be used in implementing a predetermined circuit configuration in an FPGA (Field-Programmable Gate Array) included in the flexible logic circuit 13. In the following explanation, the data to be used in implementing a circuit configuration by connecting the logical components of the FPGA is called circuit data; and the parameters provided to the circuit configuration implemented using the circuit data are called setting data.

The flexible logic circuit 13 includes an FPGA as mentioned above, and coordinates with the main processor 14 (described later) to perform processing such as black level processing, defect correction, shading correction, distortion correction, linear matrix processing, gamma correction, luminance-color separation, edge reinforcement, color difference matrix processing, and resizing/zooming with respect to the image data stored in the memory 15. Moreover, the flexible logic circuit 13 also performs a variety of other processing such as control system correction, automatic exposure (AE), automatic focusing (AF), automatic white balance adjustment (AWB), and synchronous-processing output interface (IF) processing.

The main processor 14 controls the constituent elements of the communication device 2. Moreover, the main processor 14 operates in coordination with the flexible logic circuit 13 and performs, as pipeline processing, the various operations listed above.

The driver 16 includes, for example, a vertical drive circuit, a horizontal transfer circuit, and a timing control circuit; and drives a pixel circuit (described later) installed in the high-speed signal processing circuit 12, so as to make the high-speed signal processing circuit 12 read pixel signals from the light receiving unit 11. Moreover, the driver 16 also controls the actuator that drives the optical system including lenses and shutters in the light receiving unit 11.

The nonvolatile memory 17 is configured using, for example, an EEPROM (Electrically Erasable Programmable Read-only Memory), and is used to store the parameters to be used when the driver 16 controls the circuits in the high-speed signal processing circuit 12 and controls the actuator in the light receiving unit 11.

The transceiver unit 18 is a communication unit that communicates with the server 3 via the network 4; and, for example, includes a DAC 181 that performs DA (Digital to Analog) conversion of transmission data, a transmission antenna 182 that transmits post-DA-conversion data to the network 4, a receiving antenna 184 that receives data from the network 4, and an ADC 183 that performs AD (Analog to Digital) conversion of the data received by the receiving antenna 184. Herein, the transceiver unit 18 is not limited to be a wireless unit, and can alternatively be a wired unit.

2.3 Stack Structure

Figure 3:
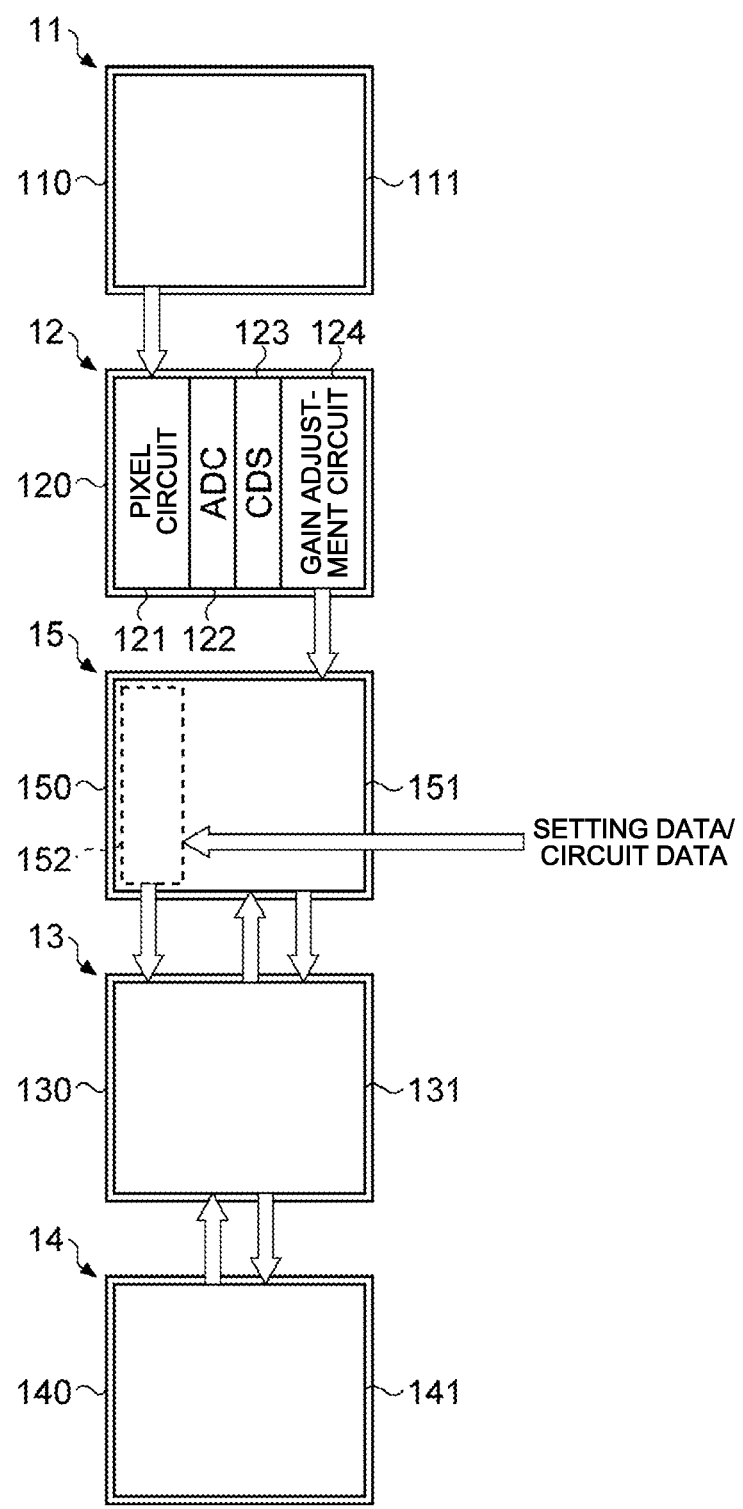
FIG. 3 is a schematic diagram illustrating a chip configuration of an image sensor according to the first embodiment.

FIG. 3 is a schematic diagram illustrating a chip configuration of the image sensor according to the first embodiment. In FIG. 3, for simplicity, the driver 16 and the nonvolatile memory 17 are not illustrated.

As illustrated in FIG. 3, in the image sensor 10, for example, the light receiving unit 11, the high-speed signal processing circuit 12, the flexible logic circuit 13, the main processor 14, and the memory 15 are configured on individual chips.

In the light receiving unit 11, an optical sensor array 111 is formed on a light receiving chip 110 made of a semiconductor substrate. In the high-speed signal processing circuit 12; a pixel circuit 121, an ADC 122, a CDS circuit 123, and a gain adjustment circuit 124 are formed on an analog/logic chip 120 made of a semiconductor substrate. The gain adjustment circuit 124 can be, for example, a circuit for adjusting the gain of post-CDS digital pixel signals in each of RGB colors.

In the flexible logic circuit 13, an FPGA 131 is formed on a flexible logic chip 130 made of a semiconductor substrate. In the main processor 14, an MPU 141 is formed on a processor chip 140 made of a semiconductor substrate. Herein, it is not necessary that only a single MPU 141 is formed on the processor chip 140, and alternatively a plurality of MPUs 141 can be formed on the processor chip 140.

In the memory 15, a memory area 151 of an SRAM (Static RAM) or a DRAM (Dynamic RAM) is formed on a memory chip 150 made of a semiconductor substrate. In the memory area 151, some portion is used as a memory area (hereinafter, called a programmable memory area) 152 used to store circuit data meant for setting the circuit configuration in the FPGA 131 and to store the related setting data.

The chips 110, 120, 130, 140, and 150 are stacked from the top in the order illustrated in FIG. 3. Thus, the image sensor 10 has a stack structure in which the light receiving chip 110, the analog/logic chip 120, the memory chip 150, the flexible logic chip 130, and the processor chip 140 are stacked in that order.

The remaining constituent elements of the image sensor 10, such as the driver 16 and the nonvolatile memory 17, can be formed either on independent chips, or on a common chip, or on any one of the chips 110, 120, 130, 140, and 150. In an identical manner, the transceiver unit 18 can be formed on an independent chip or on any one of the abovementioned chips.

Figure 4:
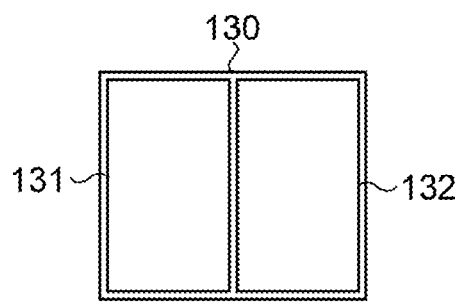
FIG. 4 is a diagram illustrating another configuration example of a flexible logic chip according to the first embodiment.
Figure 5:
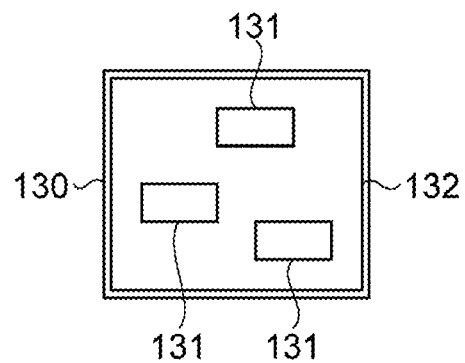
FIG. 5 is a diagram illustrating still another configuration example of the flexible logic chip according to the first embodiment.

Moreover, on the flexible logic chip 130, in addition to forming the FPGA 131, a logic circuit 132 can also be formed as illustrated in FIG. 4 or FIG. 5. In FIG. 4 is illustrated the case in which the FPGA 131 and the logic circuit 132 are formed in separated areas; and in FIG. 5 is illustrated the case in which the FPGAs 131 are formed in some parts of the logic circuit 132.

Meanwhile, in the first embodiment, the explanation is given about a stack structure in which the light receiving unit 11, the high-speed signal processing circuit 12, the flexible logic circuit 13, the main processor 14, and the memory 15 are stacked after being formed on the individual chips 110, 120, 130, 140, and 150, respectively. The stack structure can be modified in various ways as explained in the embodiments described above. For example, if a wearable terminal, such as a smartphone or a cellular phone, or a fixed imaging device, such as a fixed-point camera, that does not require high-speed image processing is used as the communication device 2; then the main processor 14, the flexible logic circuit 13, and the memory 15 are formed on a single chip, thereby enabling holding down the manufacturing cost. Alternatively, if a mobile device such as a drone, an automobile, a domestic robot, a factory automation (FA) robot, a monitoring robot, or an autonomous robot is used as the communication device 2; then the stack structure as explained in the first embodiment or in the embodiments described below can be implemented, so that the processing speed can be improved and the real-time property can be enhanced.

2.4 Operations of Image Sensor

Figure 6:
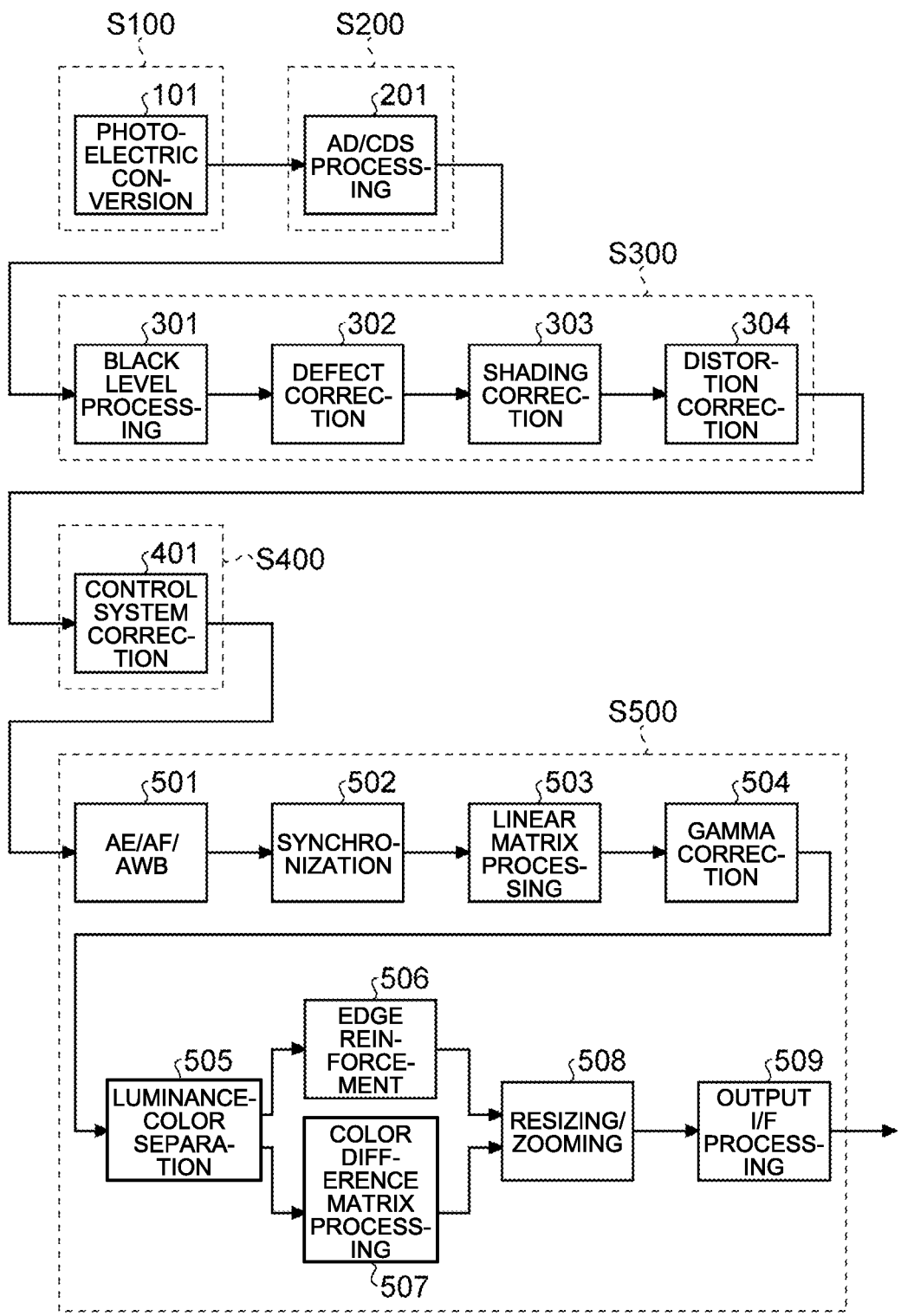
FIG. 6 is a diagram for explaining the operations performed by the image sensor according to the first embodiment.

Explained below with reference to FIG. 6 are the operations performed by the image sensor 10 in the communication device 2 illustrated in FIG. 2.

As illustrated in FIG. 6, the operations performed by the image sensor 10 can be broadly divided into the following five steps: a photoelectric conversion step S100; a signal processing step S200; a base step S300; a control system step S400; and a picture formation step S500.

At the photoelectric conversion step S100, the photoelectric conversion elements in the light receiving unit 11 perform photoelectric conversion 101 in which the incident light is converted into electrical charge according to the quantity of the incident light.

At the signal processing step S200, the electrical charge accumulated in the photoelectric conversion elements is read as analog image signals by the pixel circuit in the high-speed signal processing circuit 12. Herein, the high-speed signal processing circuit 12 can be, for example, a signal processing circuit in which a method enabling simultaneous reading of pixel signals from a plurality of pixels, such as a method for reading the pixel signals in the units of rows, is implemented.

The read analog pixel signals are then converted into digital pixel signals by the ADC in the high-speed signal processing circuit 12 (201). Then, with respect to the post-AD-conversion pixel signals, the CDS circuit in the high-speed signal processing circuit 12 performs CDS processing (201). As a result, image data having the noise removed therefrom is generated. Then, the generated image data is temporarily stored in the memory 15.

At the base step S300, the operations of black level processing 301, defect correction 302, shading correction 303, and distortion correction 304 are performed in that order with respect to the image data stored in the memory 15.

Herein, the black level processing 301 is, for example, an operation for correcting the black level of the image data by removing the noise attributed to the dark current generated in the light receiving unit 11.

The defect correction 302 is, for example, an operation for interpolating the pixel values of defective pixels, which are attributed to defective elements, based on the pixel values of the corresponding neighboring pixels.

The shading correction 303 includes correcting the unevenness in the brightness caused due to the orientation of the light source and the effects of lens aberration.

The distortion correction 304 includes correcting lens-based image distortion in the areas having a tall imaged height.

At the control system step S400, control system correction 401 is performed for correcting various parameters used by the driver 16 at the time of driving the actuator and the pixel circuit of the light receiving unit 11. Meanwhile, the control system step S400 need not always be performed after the signal processing step S200, and can be performed at an arbitrary timing.

At the picture formation step S500, the following operations are performed in that order: automatic exposure (AE)/automatic focusing (AF)/automatic white balance adjustment (AWB) (501); synchronization 502; linear matrix processing 503; gamma correction 504; luminance-color separation 505; edge reinforcement 506; color difference matrix processing 507; and resizing/zooming 508.

The automatic exposure (AE) includes automatically adjusting the charge accumulation period of the photoelectric conversion elements of the light receiving unit 11. The automatic focusing (AF) includes automatically adjusting the focal point of the optical system of the light receiving unit 11. The automatic white balance adjustment (AWB) includes automatically adjusting the white level by adjusting the gain of the RGB values read by the pixel circuit of the high-speed signal processing circuit 12.

The synchronization 502 is an operation for synchronizing the results of asynchronous processing.

The linear matrix processing 503 includes performing matrix conversion with respect to the RGB values read by the pixel circuit of the high-speed signal processing circuit 12, and adjusting the input spectral characteristics of the light receiving unit 11 to ideal values.

The gamma correction 504 includes correcting the luminance level of the image data according to the gamma characteristics of a display device (for example, a CRT (Cathode Ray Tube)).

The luminance-color separation 505 is also called YC conversion in which the color space of the RGB image data is converted to generate Y/B-Y/R-Y image data.

The edge reinforcement 506 includes improving the blurriness of the contours, which is attributed to the deterioration in the spatial frequency characteristics, by compensating for the deterioration of the spatial frequency characteristics of the image data and by reinforcing the contours.

The color difference matrix processing 507 includes performing matrix conversion with respect to the B-Y/R-Y components in the post-YC-conversion image data, and adjusting the hue and the saturation without varying the luminance.

The resizing/zooming 508 includes varying the size of the image data according to the display size of the display device, and includes zooming in on a particular area.

Subsequently, output I/F processing 509 is performed for outputting the image data that has been processed in the manner described above (hereinafter, called processed image data) to an external ISP (Image Signal Processor) or an external AP (Application Processor) via an interface (not illustrated). In the case of NTSC, for example, the output I/F processing 509 can be processing including YUV, encoding, and a camera ring. Herein, the processed image data can again be temporarily stored in the memory 15 before outputting it to the outside, or can be directly output from the flexible logic circuit 13 or the main processor 14 via the interface.

2.5 Relationship Between Each Operation and Chips

In the flow explained above, the photoelectric conversion 101 is performed, for example, in the optical sensor array 111 of the light receiving unit 11. Moreover, the AD/CDS processing 201 is performed, for example, in the ADC 122 and the CDS circuit 123 of the high-speed signal processing circuit 12.

The black level processing 301, the defect correction 302, the shading correction 303, the distortion correction 304, the control system correction 401, the AE/AF/AWB 501, the synchronization 502, the linear matrix processing 503, the gamma correction 504, the luminance-color separation 505, the edge reinforcement 506, the color difference matrix processing 507, the resizing/zooming 508, and the output I/F processing 509 are performed, for example, as a result of reading circuit data meant for implementing the respective circuit configurations from the programmable memory area 152 of the FPGA 131 in the flexible logic circuit 13, and registering the setting data for each circuit configuration in the corresponding register. Thus, the output with respect to the input of each operation can be adjusted by varying the setting data and the circuit data.

Meanwhile, as illustrated in FIG. 4 or FIG. 5, when some part of the flexible logic circuit 13 is treated as the FPGA 131 and the remaining part is treated as the logic circuit 132, the FPGA 131 can be configured to perform the defect correction 302, the shading correction 303, the distortion correction 304, the control system correction 401, the AE/AF/AWB 501, the synchronization 502, the linear matrix processing 503, and the edge reinforcement 506; while the logic circuit 132 can be configured to perform the black level processing 301, the gamma correction 504, the luminance-color separation 505, the color difference matrix processing 507, the resizing/zooming 508, and the output I/F processing 509.

The main processor 14 performs operations in coordination with the flexible logic circuit 13, so that the operations of the flexible logic circuit 13 are performed as pipeline processing.

2.6 Correction of Deterioration in Image Sensor

In the configuration explained above, for example, the optical sensor array 111 of the image sensor 10 undergoes aging deterioration due to an increase in the usage frequency and the age. Such deterioration of the image sensor 10 can be corrected, for example, by varying the circuit configuration of the FPGA 131 and the parameters thereof.

In that regard, in the first embodiment, the state of deterioration of the image sensor 10 is detected either on a constant basis, or on a periodic basis, or at arbitrary timings; and, depending on the detected state of deterioration, the circuit configuration and/or the parameters of the FPGA 131 are varied. As a result, the image sensor 10 can be customized according to its state of deterioration, so that accurate information (for example, image data) can be obtained even when the image sensor 10 undergoes deterioration due to usage and aging.

In order to correct the deterioration of the image sensor 10, for example, the image data obtained by the image sensor 10 is sent to the server 3 via the network 4.

The server 3 analyzes, for example, the image data received from the communication device 2 via the network 4, and identifies the locations of deterioration and the cause for deterioration in the image sensor 10. Then, with the aim of correcting the identified locations of deterioration and the identified cause for deterioration, the server 3 generates setting data and/or circuit data to be set in the FPGA 131 in the flexible logic circuit 13 of the image sensor 10, and sends (feeds back) the setting data and/or the circuit data to the communication device 2 via the network 4.

Upon receiving the setting data and/or the circuit data from the server 3, the communication device 2 stores the received data in the memory 15 of the image sensor 10. Then, the image sensor 10 sets the setting data and/or the circuit data, which is stored in the memory 15, in the FPGA 131 and thus corrects the locations of deterioration and the cause for deterioration.

Meanwhile, the setting data and/or the circuit data meant for correcting the locations of deterioration and the cause for deterioration can be generated using, for example, a learnt model that is obtained by performing machine learning of past data.

2.7 Sequence of Deterioration Correction

Regarding the sequence in which the image data is analyzed in the server 3 and the setting and/or the circuit configuration of the flexible logic circuit 13 in the communication device 2 is varied, the following method can be cited as an example.

Firstly, the image data is sent from the communication device 2 to the server 3.

Secondly, the image data is analyzed (subjected to machine learning) in the server 3.

Thirdly, based on the result of analysis, setting data and/or circuit data is generated in the server 3.

Fourthly, the setting data and/or the circuit data is fed back from the server 3 to the communication device 2 (binary data transfer).

Fifthly, in the communication device 2, the received setting data and/or the received circuit data is written at predetermined addresses in the programmable memory area 152 of the memory 15.

Sixthly, the setting data and/or the circuit data in the programmable memory area 152 is loaded, so as to configure new circuits in the FPGA 131 or to vary the parameters of the circuit configuration implemented in the FPGA 131.

As a result of performing the abovementioned operations on, for example, a frame-by-frame basis, the FPGA 131 can be updated on a constant basis.

Meanwhile, the layer configuration of the FPGA 131 can be appropriately varied according to the intended end-usage, such as the configuration including only the FPGA 131 (see FIG. 3), or the configuration including the FPGA 131 and the logic circuit 132 (see FIG. 4), or the configuration including the consolidation of the FPGA 131 and the logic circuit 132 (i.e., the configuration in which circuit modification is performed in the FPGA 131 with respect to the logic circuit 132 serving as the base; see FIG. 5).

Moreover, based on the result of machine learning performed in the server 3, it is also possible to add new circuits to the FPGA 131 or to modify the circuit configuration of the FPGA 131 (for example, eliminate some of the functions) for the purpose of achieving enhancement in the speed. For example, by modifying the circuit configuration of the FPGA 131, the image data output from the high-speed signal processing circuit 12 can be modified from 10-bit image data to 14-bit image data or 8-bit image data.

2.8 Analysis (Machine Learning) of Image Data

The state of deterioration of the image sensor 10 can be determined, for example, by analyzing the image data obtained by the image sensor 10. During the analysis of the image data, for example, the image data obtained by the image sensor 10 is stored in the server 3 and, at the time of analyzing the image data, the stored image data can be compared with newly-obtained image data and it can be determined whether or not there is deterioration of the image sensor 10.

At that time, as the image data to be stored in the server 3, it is possible to use the image data obtained before the shipment of the communication device 2, or the image data obtained at the time of performing initial setting of the communication device 2 after being handed over to the user, or the image data obtained at a stage at which the aging deterioration of the image sensor 10 is small.

Alternatively, the image data that is sent from the communication device 2 to the server 3 for the purpose of determining deterioration can be the image data obtained at an arbitrary timing or can be the image data obtained when a predetermined condition is satisfied. The predetermined condition can be set to a condition in which the image data is obtained by capturing the same area as the area captured in the image data stored in the server 3, or a condition in which the image data is obtained by performing imaging under the same illumination condition as the illumination condition used for obtaining the image data stored in the server 3.

Alternatively, for example, if the image sensor 10 includes a mechanical shutter, then the image obtained in the closed state of the mechanical shutter can be stored in the server 3. Subsequently, at the time of deterioration determination, the image data can be obtained with the mechanical shutter kept close, and can be sent to the server 3. In that case, the state of deterioration of the image sensor 10 can be confirmed by referring to the black level, the noise, and the defective pixels.

Moreover, during the analysis of the image data, for example, the state of deterioration and the cause for deterioration of the image data is learnt by performing machine learning; and a learnt model is built. As a result, during the subsequent analysis, it becomes possible to achieve enhancement in the accuracy and the promptness in finding the cause. Meanwhile, as far as the method for machine learning is concerned, it is possible use various techniques such as the RNN (Recurrent Neural Network) or the CNN (Convolution Neural Network).

2.9 Operation Flow

Figure 7:
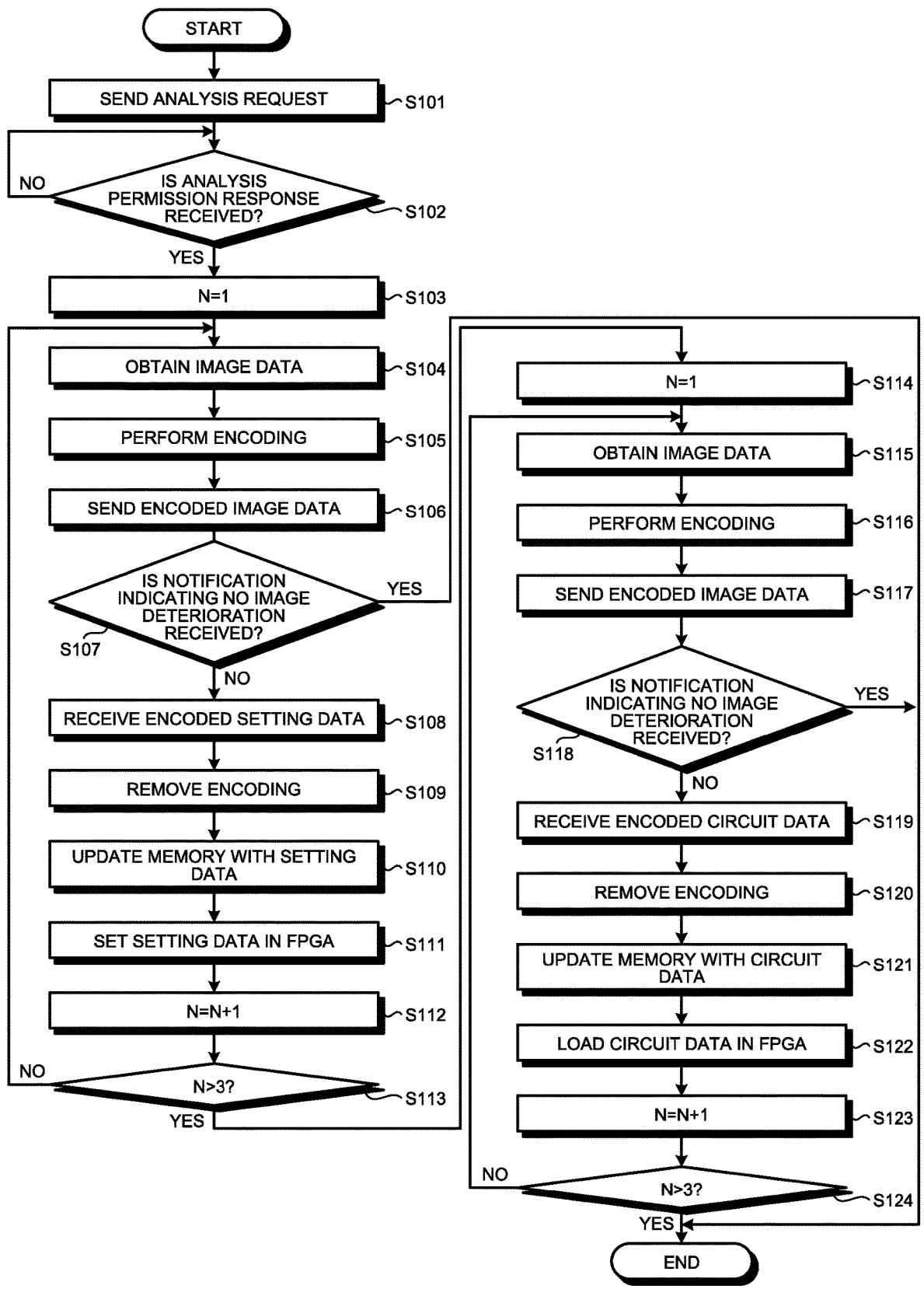
FIG. 7 is a flowchart for explaining an example of the overall operations performed in the communication device according to the first embodiment.
Figure 8:
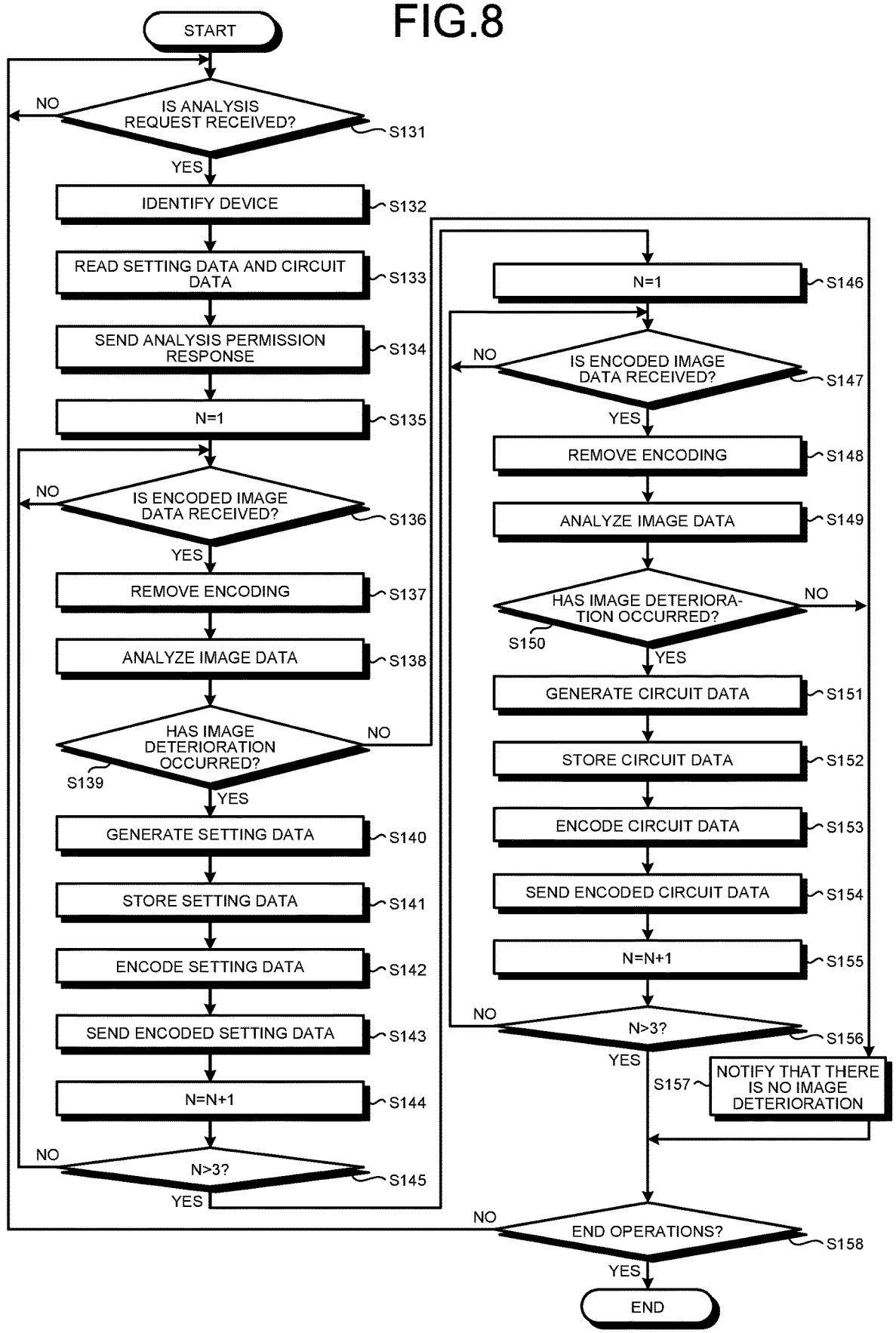
FIG. 8 is a flowchart for explaining an example of the overall operations performed in a server according to the first embodiment.

Explained below with reference to a flowchart are the operations performed at the time of detecting and correcting the deterioration of the image sensor 10. FIG. 7 is a flowchart for explaining an example of the overall operations performed in the communication device according to the first embodiment. FIG. 8 is a flowchart for explaining an example of the overall operations performed in the server according to the first embodiment.

2.9.1 Operations in Communication Device

As illustrated in FIG. 7, firstly, the communication device 2 requests the server 3, on a constant basis or on a periodic basis, to analyze the image data obtained by the image sensor 10 (Step S101), and waits for an analysis permission response from the server 3 (NO at Step S102). Upon receiving an analysis permission response from the server (YES at Step S102), the communication device 2 sets "1" in a value N that is meant for monitoring the repetition count of analysis (Step S103). Then, the communication device 2 drives the image sensor 10 and obtains image data (Step S104). The image data obtained at that time can be the processed image data on which the operation at each step illustrated in FIG. 6 has been performed.

Then, the communication device 2 performs DA conversion for converting the processed image data into analog image data and performs encoding (Step S105). Herein, the encoding can alternatively be performed in, for example, the main processor 14 or an application processor (an encoding unit) (not illustrated). Subsequently, the communication device 2 sends the encoded image data to the server 3 via the network 4 (Step S106), and waits for a response from the server 3 (NO at Step S107). On the other hand, as explained later with reference to FIG. 8, the server 3 analyzes the image data received from the communication device 2 and, if image deterioration is recognized, generates setting data to be set in the FPGA 131 for resolving the image deterioration.

If an analyzing result indicating no image deterioration is received from the server 3 (YES at Step S107), then the communication device 2 ends the present operations. On the other hand, if an analyzing result indicating image deterioration is received (NO at Step S107), then the communication device 2 receives encoded setting data from the server 3 via the network 4 (Step S108), and removes the encoding of the encoded setting data (Step S109). Herein, the removing of encoding (i.e., the decoding) can be alternatively performed, for example, in the main processor 14 or an application processor (a decoding unit) (not illustrated). Then, the communication device 2 updates the setting data of the FPGA 131, which is stored in the programmable memory area 152 of the memory area 151, with the decoded setting data (Step S110); and sets the updated setting data in the FPGA 131 (Step S111). Meanwhile, if the received setting data contains setting data about the actuator that drives the optical system of the light receiving unit 11 or contains setting data about the constituent elements of the high-speed signal processing circuit 12, then the communication device 2 updates predetermined parameters in the nonvolatile memory 17 with the setting data. As a result, the driving of the constituent elements of the driver 16 gets adjusted.

Subsequently, the communication device 2 increments the repetition count N by one (Step S112) and determines whether or not the incremented repetition count N is greater than a predetermined upper limit value of the repetition count (in this example, three) (Step S113). If the repetition count N is equal to or smaller than the upper limit value (NO at Step S113), then the control system returns to Step S104 and the communication device 2 again performs the subsequent operations. On the other hand, if the repetition count N is greater than the upper limit value (YES at Step S113), the control system proceeds to Step S114.

At Step S114, the communication device 2 resets the repetition count N to "1". Then, in an identical manner to Step S104 to Step S107 explained earlier, the communication device 2 performs DA conversion with respect to the image data obtained from the image sensor 10, performs encoding, and sends the encoded image data to the server 3 (Step S106); and then waits for a response from the server 3 (Step S115 to Step S118). On the other hand, as explained later with reference to FIG. 8, the server 3 analyzes the image data received from the communication device 2 and, if image deterioration is recognized, generates circuit data to be incorporated into the FPGA 131 for resolving the image deterioration.

If an analysis result indicating no image deterioration is received from the server 3 (YES at Step S118), then the communication device 2 ends the present operations. On the other hand, if an analysis result indicating image deterioration is received (NO at Step S118), then the communication device 2 receives the encoded circuit data from the server 3 via the network 4 (Step S119), and removes the encoding of the encoded circuit data (Step S120). Then, the communication device 2 updates the circuit data of the FPGA 131, which is stored in the programmable memory area 152 of the memory area 151, with the decoded circuit data (Step S121); and incorporates the updated circuit data in the FPGA 131 so as to modify the circuit configuration of the FPGA 131 (Step S122).

Subsequently, the communication device 2 increments the repetition count N by one (Step S123) and determines whether or not the incremented repetition count N is greater than a predetermined upper limit value of the repetition count (in this example, three) (Step S124). If the repetition count N is equal to or smaller than the upper limit value (NO at Step S124), then the control system returns to Step S115 and the communication device 2 again performs the subsequent operations. On the other hand, if the repetition count N is greater than the upper limit value (YES at Step S124), then the communication device 2 ends the present operations.

2.9.2 Operations in Server

As illustrated in FIG. 8, after the present operations are activated, the server 3 waits for an analysis request from the communication device 2 (NO at Step S131). Upon receiving an analysis request (YES at Step S132), firstly, the server 3 identifies the communication device 2 that issues the analysis request (Step S132).

Once the communication device 2 that issues the analysis request is successfully identified, the server 3 reads, from a predetermined memory device, the circuit data and the setting data stored in the programmable memory area 152 of the identified communication device (Step S133); and sends an analysis permission response to the communication device 2 that issued the analysis request (Step S134). In the memory device of the server 3, the circuit data and the setting data stored in the programmable memory area 152 of each registered communication device 2 is stored in corresponding manner to that communication device 2. That is, the circuit data and the setting data of each communication device 2 is shared between the communication device 2 and the server 3.

Then, the server 3 sets the repetition count N to "1" (Step S135) and waits until encoded image data is received from the communication device 2 (NO at Step S136). Upon receiving encoded image data (YES at Step S136), the server 3 removes the encoding of the encoded image data (Step S137), analyzes the decoded image data (Step S138), and accordingly determines whether or not there is image deterioration (Step S139).

If there is no image deterioration (NO at Step S139), then the server 3 notifies the communication device 2 that there is no image deterioration (Step S157), and the system control proceeds to Step S158. On the other hand, if there is image deterioration (YES at Step S139), then the server 3 identifies the cause for image deterioration in the image sensor 10 based on the result of analysis obtained at Step S138, and generates new setting data for the identified location (Step S140). Subsequently, the server 3 stores the generated setting data in a corresponding manner to the concerned communication device 2 in a predetermined memory device (Step S141); encodes the generated setting data (Step S142); and sends the encoded setting data to the concerned communication device 2 via the network 4 (Step S143). Meanwhile, as described earlier, the new setting data can be generated using a learnt model that is obtained by performing machine learning of past data.

Then, the server 3 increments the repetition count N by one (Step S144) and determines whether or not the incremented repetition count N is greater than the predetermined upper limit value of the repetition count (in this example, three) (Step S145). If the repetition count N is equal to or smaller than the upper limit value (NO at Step S145), then the control system returns to Step S136 and the server 3 again performs the subsequent operations. On the other hand, if the repetition count N is greater than the upper limit value (YES at Step S145), the communication device 2 proceeds to Step S146.

At Step S146, the server 3 resets the repetition count N to "1". Then, the server 3 waits until encoded image data is received from the communication device 2 (NO at Step S147). Upon receiving the encoded image data (YES at Step S147), the server 3 removes the encoding of the encoded image data (Step S148); analyzes the decoded image data (Step S149); and accordingly determines whether or not there is image deterioration (Step S150).

If there is no image deterioration (NO at Step S150), then the server 3 notifies the communication device 2 that there is no image deterioration (Step S157), and the system control proceeds to Step S158. On the other hand, if there is image deterioration (YES at Step S150); then, based on the result of analysis obtained at Step S149, the server 3 identifies the location causing image deterioration in the image sensor 10 and generates new circuit data for the identified location (Step S151). Subsequently, the server 3 stores the generated circuit data in a corresponding manner to the communication device 2 in a predetermined memory device (Step S152); encodes the generated circuit data (Step S153); and sends the encoded circuit data to the communication device 2 via the network 4 (Step S154). Meanwhile, as described earlier, the new circuit data can be generated using a learnt model that is obtained by performing machine learning of past data.

Then, the server 3 increments the repetition count N by one (Step S155) and determines whether or not the incremented repetition count N is greater than the predetermined upper limit value of the repetition count (in this example, three) (Step S156). If the repetition count N is equal to or smaller than the upper limit value (NO at Step S156), then the control system returns to Step S147 and the server 3 again performs the subsequent operations. On the other hand, if the repetition count N is greater than the upper limit value (YES at Step S156), the communication device 2 proceeds to Step S158.

At Step S158, the server 3 determines whether or not to end the present operations. If it is determined to end the operations (YES at Step S158), the server 3 ends the operations. However, if it is determined not to end the operations (NO at Step S158), the system control returns to Step S131 and the server 3 performs the subsequent operations.

As a result of performing such operations, the circuit configuration and/or the parameters of the FPGA 131 in the flexible logic circuit 13 of the communication device 2 get customized, and the deterioration in the image sensor 10 is corrected. As a result, in the communication device 2, it becomes possible to obtain image data in a good state.

Meanwhile, the frequency of uploading image data from the communication device 2 to the server 3 can be appropriately changed. Moreover, for example, in a drone, an automobile, or a robot in which the real-time property is important, it is desirable that the image data sent from the communication device 2 to the server 3 has a small data volume. In such a case, in order to reduce the data volume of the image data, the target image data for transmission can be compressed to the VGA level or the QVGA level, or can be compressed by performing binning.

2.10 Modification in Setting Data/Circuit Data

In FIG. 9 is illustrated a table of exemplary items (setting data and circuit data) that are modified according to the state of deterioration of the image sensor 10 as identified by analyzing the image data.

As illustrated in FIG. 9, the causes for deterioration include the cause attributed to the photoelectric conversion elements in the optical sensor array 111 of the image sensor 10, and the cause attributed to the optical system module such as the lenses and the actuator. For example, if the cause for deterioration can be recognized to be in the black level processing 301, the AE/AF/AWB 501, the synchronization 502, the linear matrix processing 503, the gamma correction 504, the luminance-color separation 505, the edge reinforcement 506, or the color difference matrix processing 507; then it is believed that the cause for deterioration lies in the photoelectric conversion elements (sensor). On the other hand, if the cause for deterioration can be recognized to be in the shading correction 303, the distortion correction 304, the control system correction 401, or the resizing/zooming 508; then it is believed that the cause for deterioration lies in the optical system module. Moreover, if the cause for deterioration can be recognized to be in the defect correction 302, then it is believed that the cause for deterioration lies in at least either the photoelectric conversion elements or the optical system module.

In that regard, in the first embodiment, as illustrated in the table in FIG. 9, when the cause for deterioration is recognized to be in the black level processing 301; for example, the optical black (OB) value representing a part of the setting data is modified.

When the cause for deterioration is recognized to be in the defect correction 302; for example, either a defect correction value is added to the setting data, or a correction circuit equal to or greater than the cluster in the circuit data is modified, or a shimmy improvement circuit in the circuit data is modified.

When the cause for deterioration is recognized in the shading correction 303; for example, either a shading correction value representing a part of the setting data is modified or a shading algorithm in the circuit data is modified (for example, a shading curve function is modified).

When the cause for deterioration is recognized to be in the distortion correction 304; for example, a distortion correction circuit (for correcting pin-cushion distortion or barrel distortion) is added to the circuit data.

When the cause for deterioration is recognized to be in the control system correction 401; for example, either the AF, the OIS (i.e., the anti-shake function), and/or the calibration data is modified; or a driver control adjustment forward circuit is added to the circuit data with the aim of servo adjustment, whole gain adjustment, and/or optical axis adjustment.

When the cause for deterioration is recognized to be in the AE/AF/AWB 501; for example, the algorithm of the circuit for executing the AE and the AWB is modified in the circuit data.

When the cause for deterioration is recognized to be in the synchronization 502; for example, either an interpolation correction value representing a part of the setting data is modified or an interpolation algorithm in the circuit data is modified.

When the cause for deterioration is recognized to be in the linear matrix processing 503; for example, either a dispersion correction value representing a part of the setting data is modified or an equality function algorithm in the circuit data is modified.

When the cause for deterioration is recognized to be in the gamma correction 504; for example, a gamma correction value (contrast) representing a part of the setting data is modified.

When the cause for deterioration is recognized to be in the edge reinforcement 506; for example, either a contour (aperture) correction/noise correction value representing a part of the setting data is modified, or a contour (aperture) correction/noise correction algorithm in the circuit data is modified.

When the cause for deterioration is recognized to be in the color difference matrix processing 507; for example, a color matrix value representing a part of the setting data is modified.

When the cause for deterioration is recognized to be in the resizing/zooming 508; for example, a zoom value representing a part of the setting data is modified.

When the cause for deterioration is recognized to be in the output I/F processing 509; for example, a mode-based output lane representing a part of the setting data is modified.

As a result of modifying the setting data and/or the circuit data, for example, it becomes possible to hold down image deterioration in the areas having the imaged height equal to or greater than 80%. Meanwhile, when a memory is to be added, the configuration can be done to enable memory addition.

2.11 Method of High-Speed Processing

Given below is the explanation of the high-speed processing performed in the communication device 2 according to the first embodiment, while comparing it with the conventional case.

Figure 10:
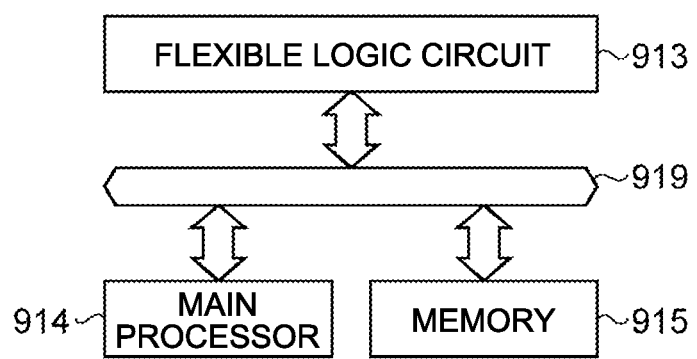
FIG. 10 is a block diagram illustrating a conventional device configuration.
Figure 11:
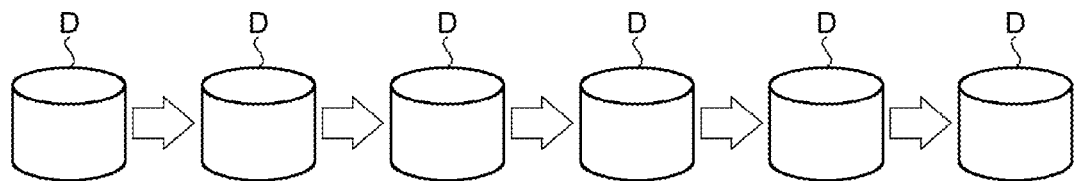
FIG. 11 is a diagram for explaining a flow of data processing performed in the device configuration illustrated in FIG. 10.
Figure 13:
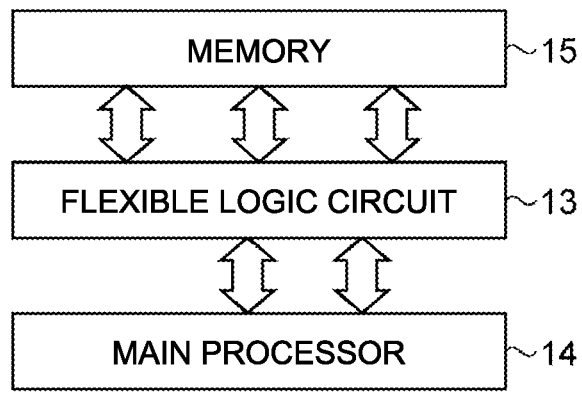
FIG. 13 is a block diagram illustrating a device configuration of the image sensor according to the first embodiment.
Figure 14:
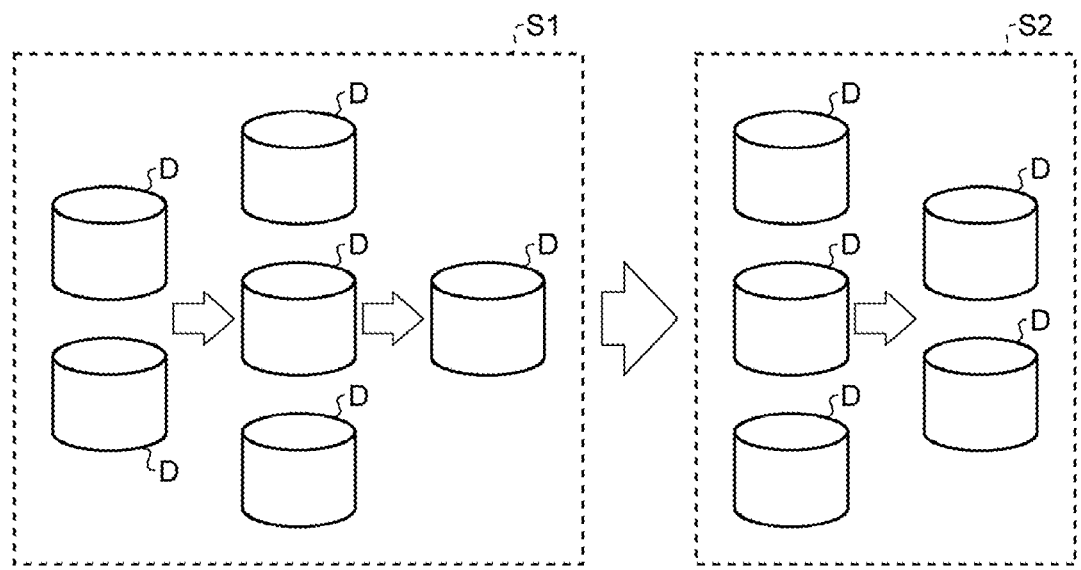
FIG. 14 is a diagram for explaining a flow of data processing performed in the image sensor according to the first embodiment.

FIG. 10 is a block diagram illustrating a conventional device configuration. FIG. 11 is a diagram for explaining a flow of data processing performed in the device configuration illustrated in FIG. 10. FIG. 12 is a diagram illustrating the clock cycle count required at the time of processing 1000 sets of data in the device configuration illustrated in FIG. 10. FIG. 13 is a block diagram illustrating a device configuration of the image sensor according to the first embodiment. FIG. 14 is a diagram for explaining a flow of data processing performed in the image sensor according to the first embodiment. FIG. 15 is a diagram illustrating the clock cycle count required at the time of processing 1000 sets of data in the image sensor according to the first embodiment.

As illustrated in FIG. 10, in a conventional device configuration in which a logic circuit 913 is connected to a main processor 914 and a memory 915 via a bus 919; the logic circuit 913, the main processor 914, and the memory 15 are consolidated in a single layer. Hence, sequential processing enables execution of complex programs in a flexible manner.

However, since the memory 15 is shared among the circuits (also called arithmetic units) performing various operations, there are disadvantages such as a drop occurs in the performance accompanying an increase in the number of processor cores, and a long period of time is required to perform parallel processing. For example, at the time of performing various operations illustrated in FIG. 6, the main processor 914 needs to retrieve the target sets of data one by one from the memory 915 via the bus 919, and perform the operations by sequentially inputting the sets of data to the logic circuit 913. Thus, in a conventional device configuration, as illustrated in FIG. 11, there is a flow of sequential processing in which the processing of each set of data D is performed in a sequential manner.

For that reason, for example, in the case of processing 1000 instructions of the same level, since only a single instruction can be executed per clock, at least 1000 clock cycles are required to process all instructions, as illustrated in FIG. 12.

In contrast, the image sensor 10 according to the first embodiment has a stack structure formed by stacking the chips 110, 120, 130, 140, and 150 that perform various operations. Hence, as illustrated in FIG. 13, in the image sensor 10, the flexible logic circuit 13 becomes able to directly retrieve data from the memory 15 and perform processing.

Thus, using the benefits of such a stack structure, there are advantages such as complex programs can be executed in a flexible manner, and the idle data in the main processor 14 can be retrieved and subjected to parallel processing in the flexible logic circuit 13 by generating a register and an arithmetic circuit in the flexible logic circuit 13. For example, as illustrated in FIG. 14, in the image sensor 10, it becomes possible to perform pipeline processing in which a plurality of sets of data D can be processed in parallel.

In this way, as a result of enabling parallel processing, the real-time property can be enhanced. Moreover, even in the case in which the next processing is of a different type, the circuit configuration of the FPGA 131 can be modified so that complex programs too can be executed in a flexible manner.

For example, is two instructions can be executed per clock, that is, if the degree of parallelism in the pipeline processing is equal to two; then, as illustrated in FIG. 15, the number of clock cycles required to process 1000 instructions of the same level can be held down to 500, which is half the number required in the conventional device structure illustrated in FIG. 12. That is, by further increasing the degree of parallelism in the pipeline processing, the number of clock cycles required to process instructions of the same level can be reduced to about 1/(multiple of the number of clock cycles).

Moreover, as illustrated in FIG. 14, if the first instance of processing S1 is subjected to machine learning; then, in the second instance of processing S2 and thereafter, the number of sets of data D to be processed can be reduced, thereby enabling achieving further high-speed processing.

Meanwhile, the addition of new circuits to the FPGA 131 or modifications of the circuit configuration (such as improving parallel processing or eliminating some functions) for enhancing the processing speed can be performed using machine learning based on the analysis of image data in the server 3.

2.12 Actions/Effects

As described above, according to the first embodiment, based on the image data obtained by the image sensor 10, the parameters and the circuit configuration of the FPGA 131 can be modified to correct image deterioration. As a result, even when the image sensor 10 undergoes deterioration, it becomes possible to obtain accurate image data.

Moreover, the image sensor 10 according to the first embodiment has a stack structure formed by stacking the light receiving chip 110, the analog/logic chip 120, the memory chip 150, the flexible logic chip 130, and the processor chip 140. As a result, the light receiving unit 11, the high-speed signal processing circuit 12, the memory 15, the flexible logic circuit 13, and the main processor 14 become connectible without involving a bus. Hence, it becomes possible to execute complex programs in a flexible manner; to retrieve idle data from the main processor 14 and generate a register and arithmetic circuits in the FPGA 131; and to perform parallel processing in a pipeline. That enables achieving enhancement in the real-time property and enables dealing with complex programs in a flexible manner.

3. Second Embodiment

A second embodiment is described below in detail with reference to the accompanying drawings. In the first embodiment described above, the light receiving unit 11 and the high-speed signal processing circuit 12 are formed on different chips (the light receiving chip 110 and the analog/logic chip 120, respectively; see FIG. 3). In contrast, in the second embodiment, the explanation with reference to examples is given for a case in which the light receiving unit 11 and the high-speed signal processing circuit 12 are formed on the same chip. In the following explanation; the configuration, the operations, and the effects identical to the first embodiment are not explained again.

3.1 Device Configuration

Figure 16:
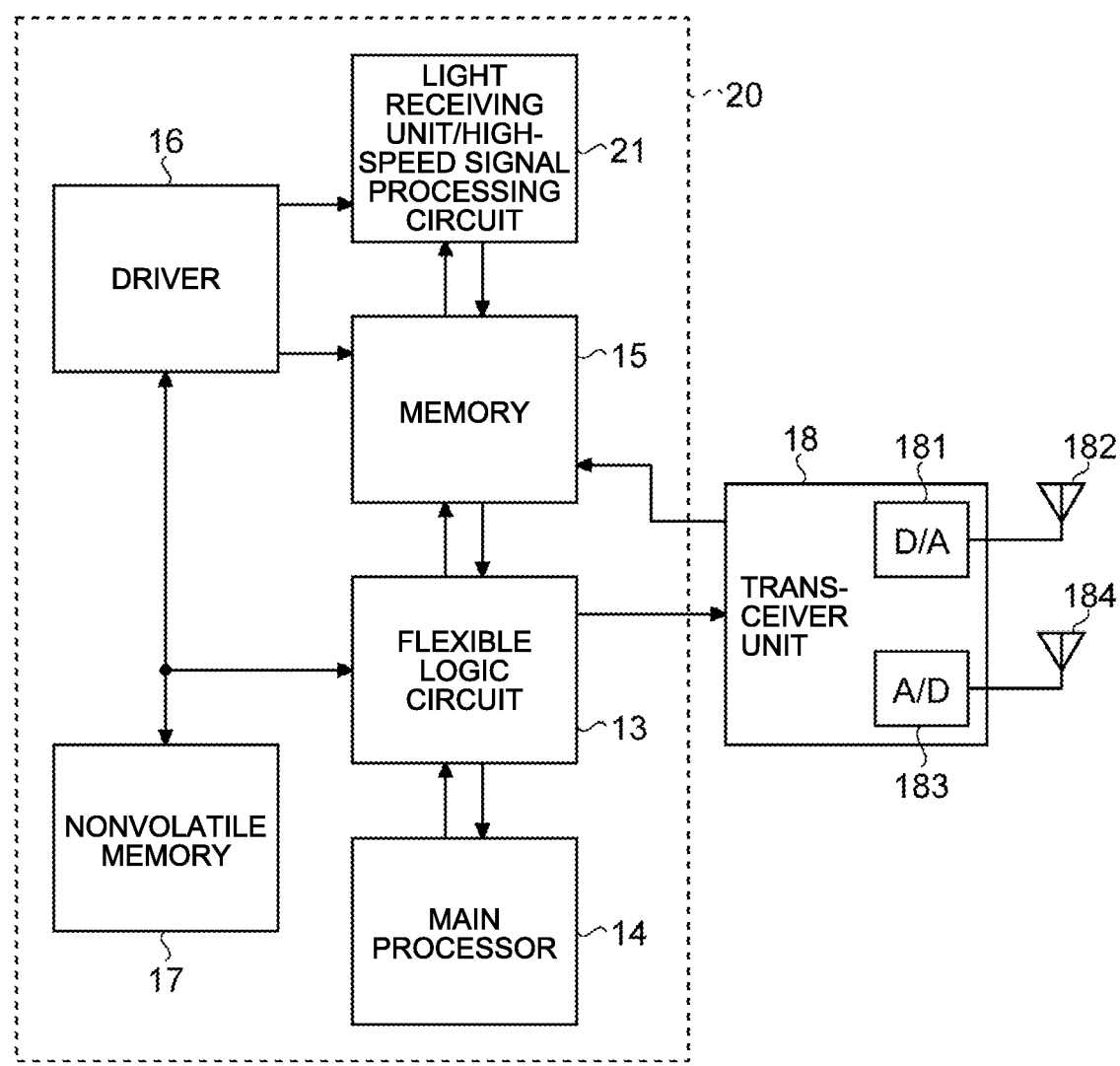
FIG. 16 is a block diagram illustrating an exemplary schematic configuration of a communication device according to a second embodiment.

FIG. 16 is a block diagram illustrating an exemplary schematic configuration of a communication device according to the second embodiment. As illustrated in FIG. 16, for example, an image sensor 20 according to the second embodiment includes a light receiving unit/high-speed signal processing circuit 21, the flexible logic circuit 13, the main processor 14, the memory 15, the driver 16, and the nonvolatile memory 17. Herein, the flexible logic circuit 13, the main processor 14, the memory 15, the driver 16, and the nonvolatile memory 17, along with the transceiver unit 18 can be identical to the constituent elements explained with reference to FIG. 2 according to the first embodiment.

3.2 Chip Configuration

Figure 17:
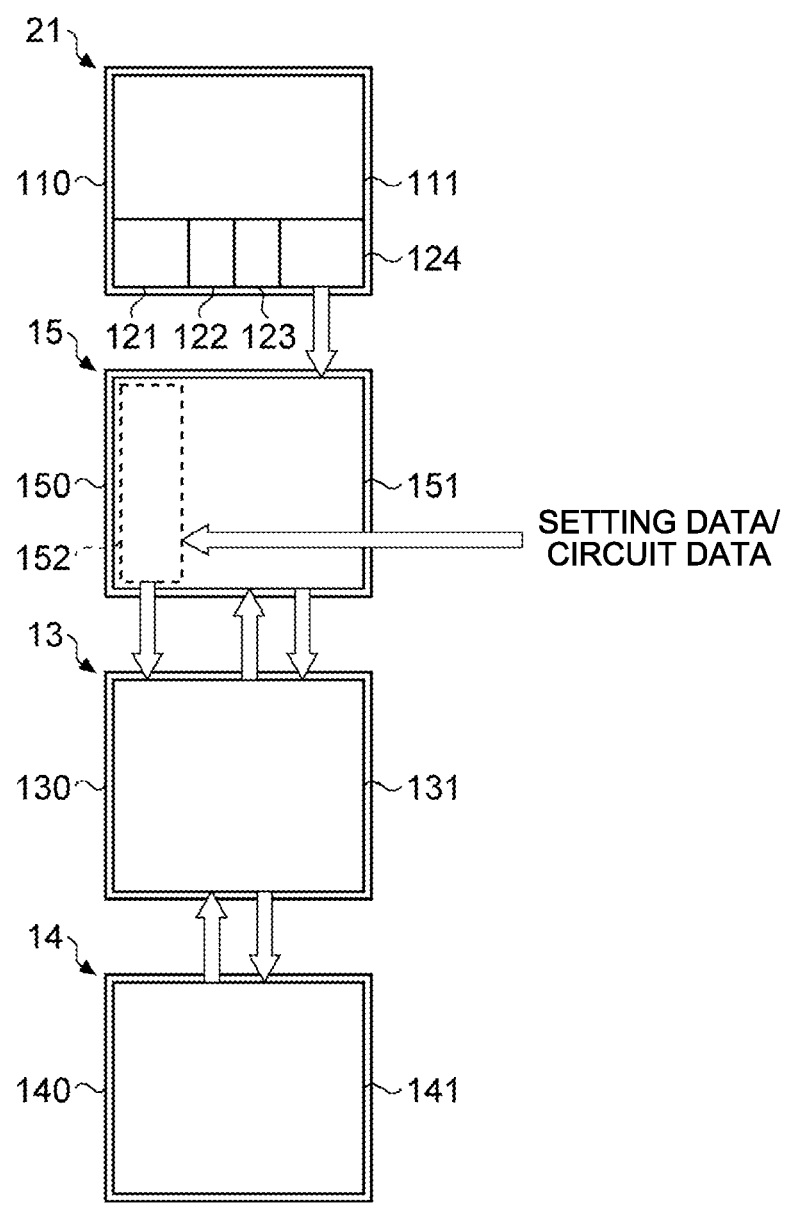
FIG. 17 is a schematic diagram illustrating a chip configuration of an image sensor according to the second embodiment.

FIG. 17 is a schematic diagram illustrating a chip configuration of the image sensor according to the second embodiment. In FIG. 17, for simplicity, the driver 16 and the nonvolatile memory 17 are not illustrated in an identical manner to FIG. 3.

As illustrated in FIG. 17, in the image sensor 20, the optical sensor array 111 constituting the light receiving unit 11; the pixel circuit 121 constituting the high-speed signal processing circuit 12; the ADC 122; the CDS circuit 123; and the gain adjustment circuit 124 are formed on the single light receiving chip 110.

3.3 Actions/Effects

With the configuration explained above, in an identical manner to the first embodiment, based on the image data obtained in the image sensor 20, the parameters and the circuit configuration of the FPGA 131 can be modified to correct image deterioration. As a result, even when the image sensor 20 undergoes deterioration, it becomes possible to obtain accurate image data.

The remaining configuration, the remaining operations, and the remaining effects can be identical to the first embodiment. Hence, the detailed explanation thereof is not repeated.

4. Third Embodiment

In the first embodiment described earlier, the memory 15 is disposed immediately under the high-speed signal processing circuit 12. However, the position of the memory 15 is not limited to be immediately under the high-speed signal processing circuit 12. In that regard, in the third embodiment, the explanation with reference to examples is given about a case in which the memory 15 is disposed as the undermost layer in the stack structure. In the following explanation; the configuration, the operations, and the effects identical to the embodiments described above are not explained again.

4.1 Device Configuration

Figure 18:
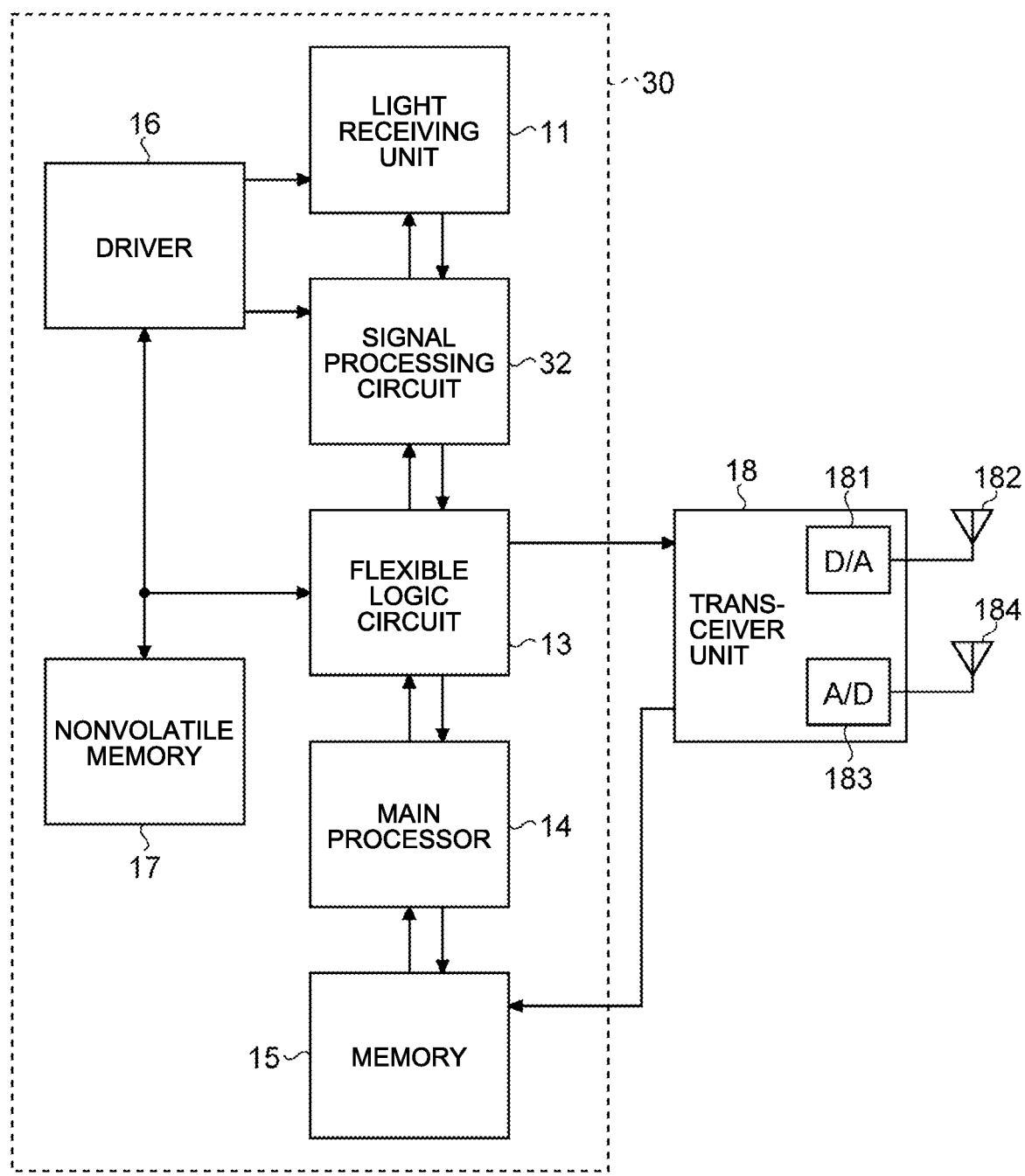
FIG. 18 is a block diagram illustrating an exemplary schematic configuration of a communication device according to a third embodiment.

FIG. 18 is a block diagram illustrating an exemplary schematic configuration of a communication device according to the third embodiment. As illustrated in FIG. 18, in an image sensor 30 according to the third embodiment, for example, in the configuration identical to the image sensor 10 explained with reference to FIG. 2 according to the first embodiment, the memory 15 is disposed under the main processor 14 representing the undermost layer. Moreover, in the image sensor 30, a signal processing circuit 32 is substituted for the high-speed signal processing circuit 12 of the image sensor 10. The signal processing circuit 32 can be a signal processing circuit capable of performing high-speed reading in the same way as the high-speed signal processing circuit 12, or can be a signal processing circuit for performing reading at lower speeds as compared to the high-speed signal processing circuit 12. The remaining configuration can be identical to the configuration explained with reference to FIG. 2 according to the first embodiment.

4.2 Chip Configuration

Figure 19:
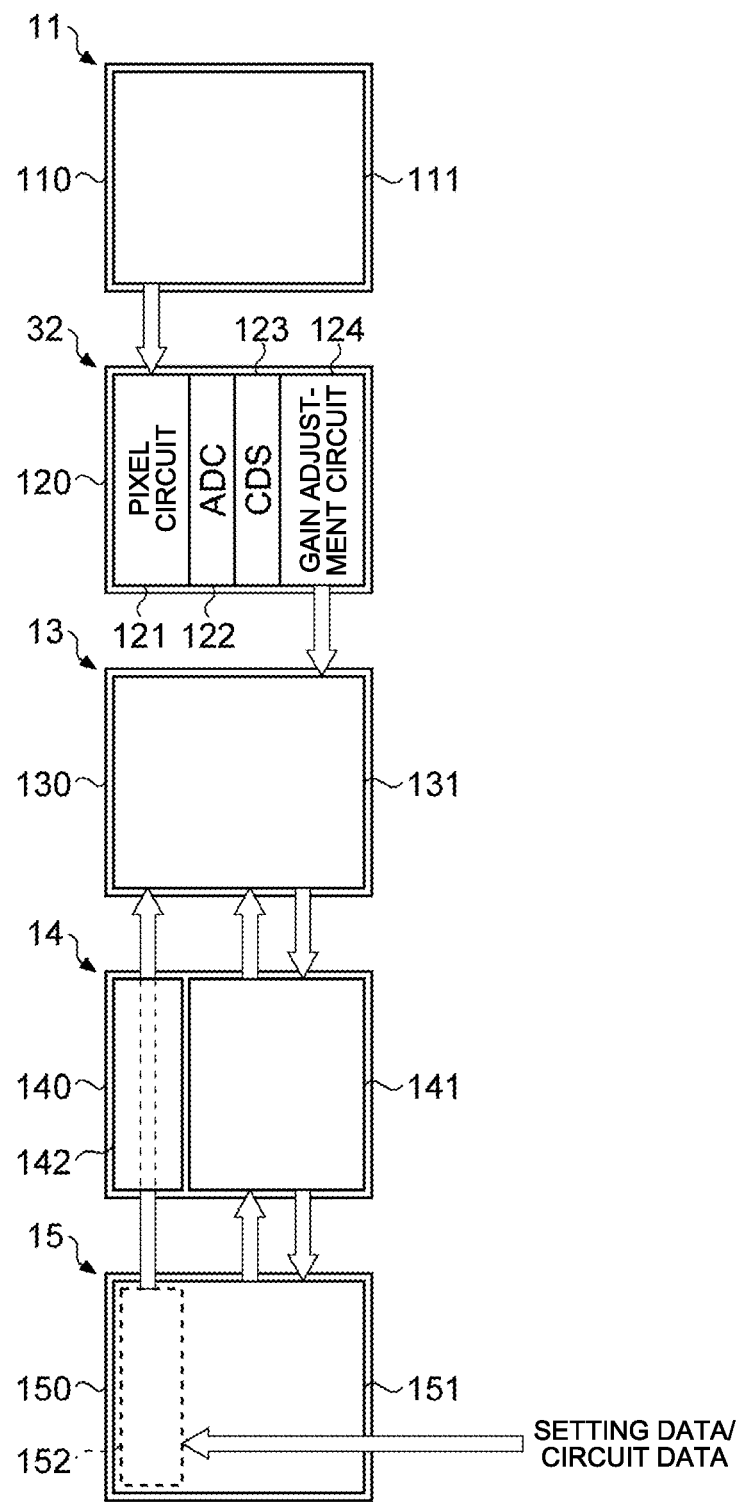
FIG. 19 is a schematic diagram illustrating a chip configuration of an image sensor according to the third embodiment.

FIG. 19 is a schematic diagram illustrating a chip configuration of the image sensor according to the third embodiment. In FIG. 19, for simplicity, the driver 16 and the nonvolatile memory 17 are not illustrated in an identical manner to FIG. 3.

As illustrated in FIG. 19, in the image sensor 30, on the processor chip 140 that is present in between the flexible logic chip 130 and the memory chip 150; a through wiring 142 is laid for directly connecting the FPGA 131 on the flexible logic chip 130 with the programmable memory area 152 of the memory area 151 on the memory chip 150. Thus, the FPGA 131 and the programmable memory area 152 are directly connected to each other via the through wiring 142.

Herein, for example, the through wiring 142 can be TSV (Through Silicon Via) passing through the processor chip 140.

4.3 Actions/Effects

With such a configuration too, in an identical manner to the embodiments described above, based on the image data obtained by the image sensor 30, the parameters and the circuit configuration of the FPGA 131 can be modified to correct image deterioration. As a result, even when the image sensor 30 undergoes deterioration, it becomes possible to obtain accurate image data.

The remaining configuration, the remaining operations, and the remaining effects can be identical to the first embodiment. Hence, the detailed explanation thereof is not repeated.

5. Fourth Embodiment

In the third embodiment described earlier, the light receiving unit 11 and the signal processing circuit 32 are formed on different chips (the light receiving chip 110 and the analog/logic chip 120, respectively; see FIG. 19). In contrast, in a fourth embodiment, the explanation with reference to examples is given for a case in which the light receiving unit 11 and the signal processing circuit 32 are formed on the same chip. In the following explanation; the configuration, the operations, and the effects identical to the embodiments described above are not explained again.

5.1 Device Configuration

Figure 20:
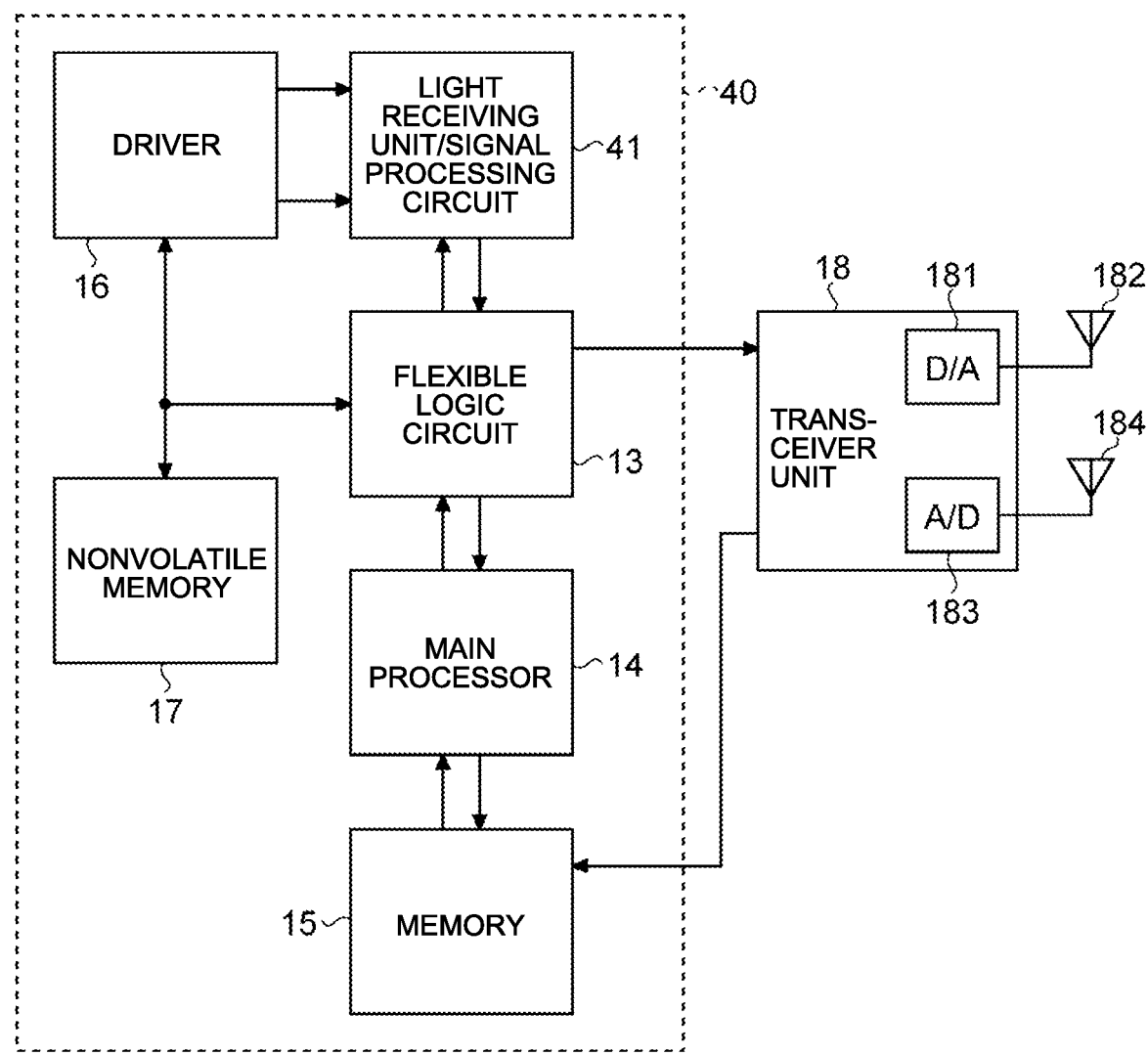
FIG. 20 is a block diagram illustrating an exemplary schematic configuration of a communication device according to a fourth embodiment.

FIG. 20 is a block diagram illustrating an exemplary schematic configuration of a communication device according to the fourth embodiment. As illustrated in FIG. 20, for example, an image sensor 40 according to the fourth embodiment includes a receiving unit/signal processing circuit 41, the flexible logic circuit 13, the main processor 14, the memory 15, the driver 16, and the nonvolatile memory 17. Herein, the flexible logic circuit 13, the main processor 14, the memory 15, the driver 16, and the nonvolatile memory 17, along with the transceiver unit 18 can be identical to the constituent elements explained with reference to FIG. 2 according to the first embodiment.

5.2 Chip Configuration

Figure 21:
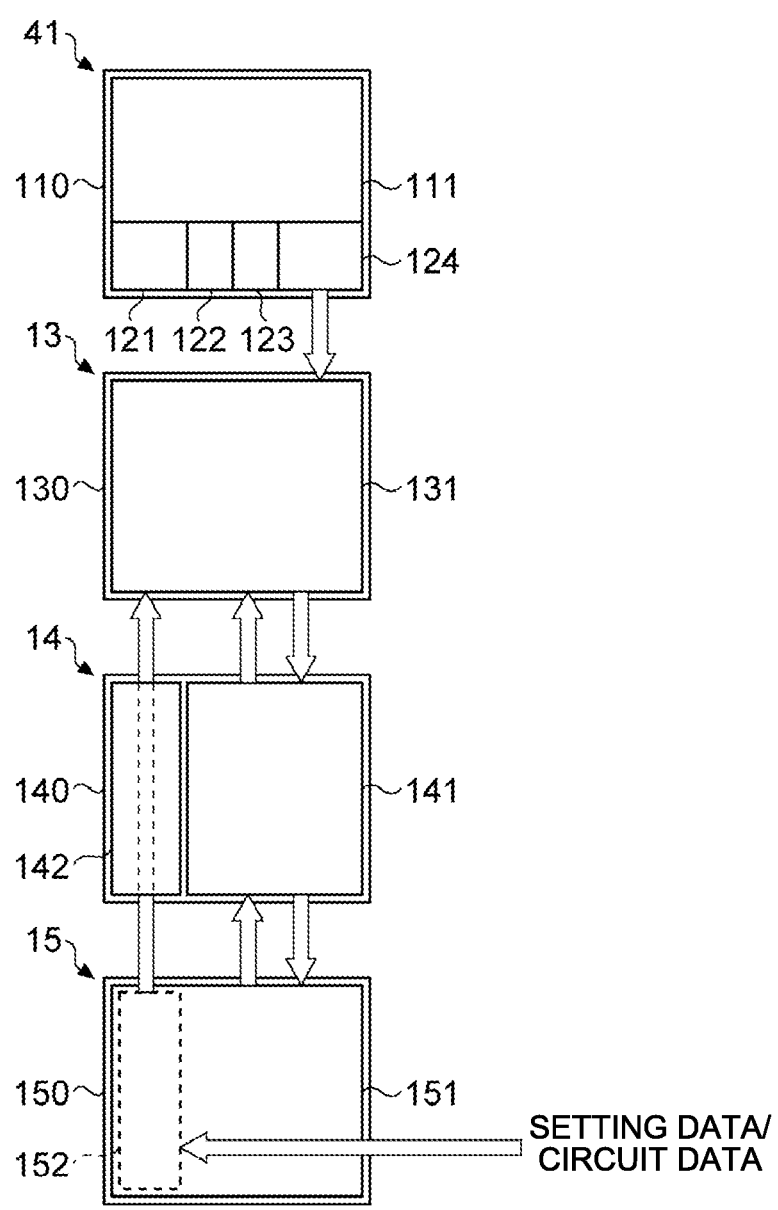
FIG. 21 is a schematic diagram illustrating a chip configuration of an image sensor according to the fourth embodiment.

FIG. 21 is a schematic diagram illustrating a chip configuration of the image sensor according to the fourth embodiment. In FIG. 21, for simplicity, the driver 16 and the nonvolatile memory 17 are not illustrated in an identical manner to FIG. 3.

As illustrated in FIG. 21, in the image sensor 40, the optical sensor array 111 constituting the light receiving unit 11; the pixel circuit 121 constituting the signal processing circuit 32; the ADC 122; the CDS circuit 123; and the gain adjustment circuit 124 are formed on the single light receiving chip 110.

5.3 Actions/Effects

With such a configuration too, in an identical manner to the configurations described above, based on the image data obtained by the image sensor 40, the parameters and the circuit configuration of the FPGA 131 can be modified to correct image deterioration. As a result, even when the image sensor 40 undergoes deterioration, it becomes possible to obtain accurate image data.

The remaining configuration, the remaining operations, and the remaining effects can be identical to the embodiments described above. Hence, the detailed explanation thereof is not repeated.

6. Fifth Embodiment

In the fourth embodiment described above, the light receiving unit 11 and the signal processing circuit 32 are formed on the single light receiving chip 110 (see FIG. 21). In contrast, in a fifth embodiment, the explanation with reference to examples is given for a case in which the signal processing circuit 32 and the flexible logic circuit 13 are formed on the same chip. In the following explanation; the configuration, the operations, and the effects identical to the embodiments described above are not explained again.

6.1 Device Configuration

Figure 22:
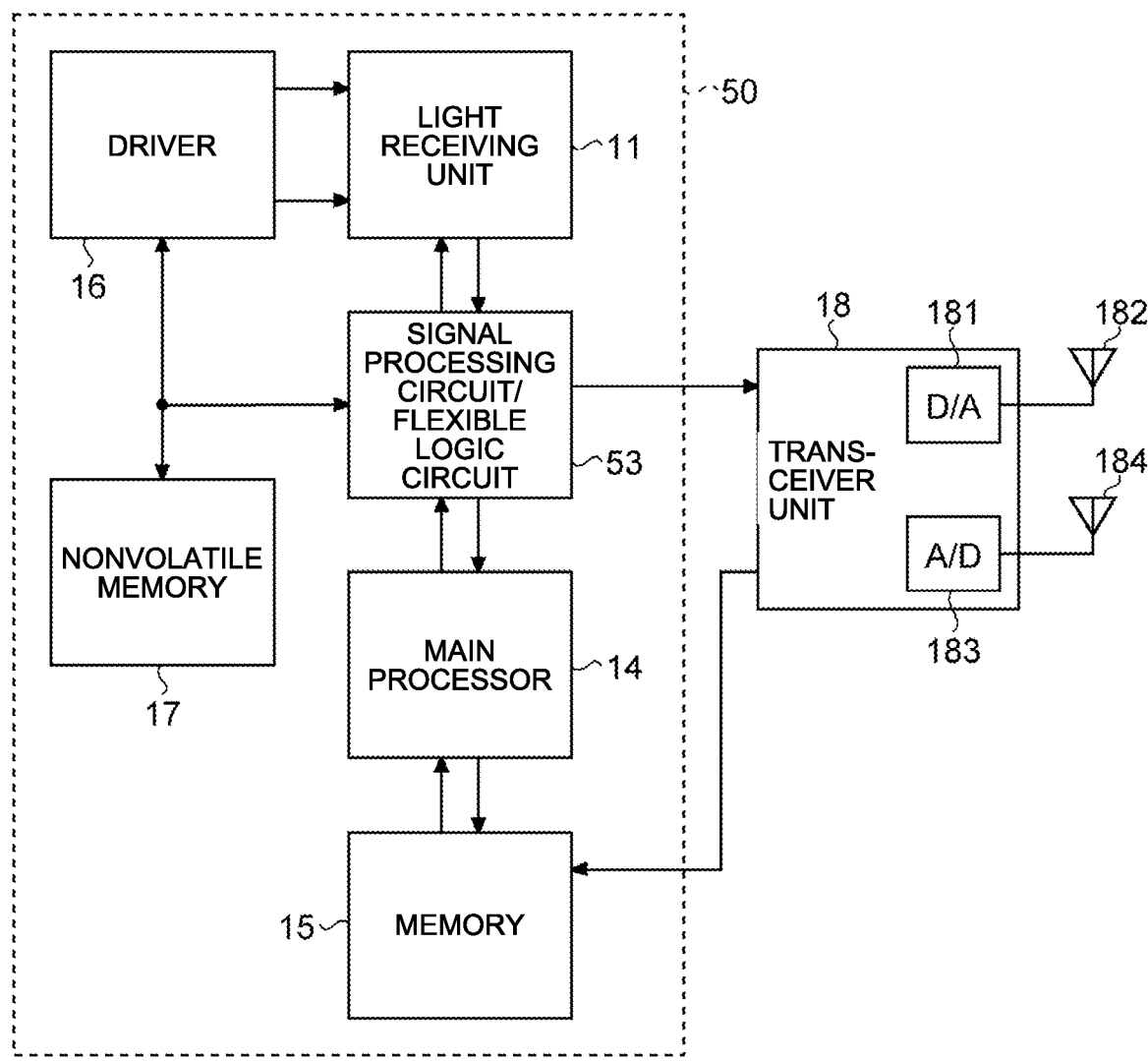
FIG. 22 is a block diagram illustrating an exemplary schematic configuration of a communication device according to a fifth embodiment.

FIG. 22 is a block diagram illustrating an exemplary schematic configuration of a communication device according to the fifth embodiment. As illustrated in FIG. 22, for example, an image sensor 50 according to the fifth embodiment includes the light receiving unit 11, a signal processing circuit/flexible logic circuit 53, the main processor 14, the memory 15, the driver 16, and the nonvolatile memory 17. Herein, the light receiving unit 11, the main processor 14, the memory 15, the driver 16, and the nonvolatile memory 17, along with the transceiver unit 18 can be identical to the constituent elements explained with reference to FIG. 2 according to the first embodiment.

6.2 Chip Configuration

Figure 23:
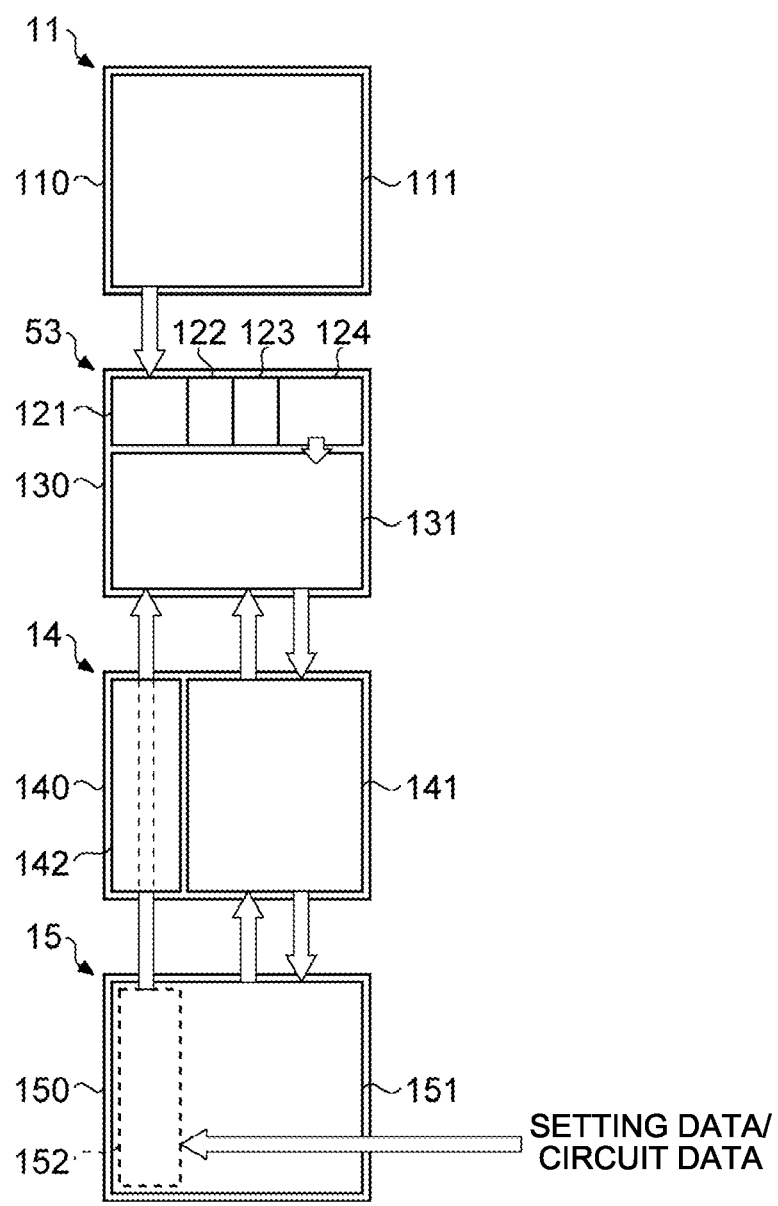
FIG. 23 is a schematic diagram illustrating a chip configuration of an image sensor according to the fifth embodiment.

FIG. 23 is a schematic diagram illustrating a chip configuration of the image sensor according to the fifth embodiment. In FIG. 23, for simplicity, the driver 16 and the nonvolatile memory 17 are not illustrated in an identical manner to FIG. 3.

As illustrated in FIG. 23, in the image sensor 50, the pixel circuit 121 constituting the signal processing circuit 32; the ADC 122; the CDS circuit 123; the gain adjustment circuit 124; and the FPGA 131 (and the logic circuit 132) constituting the flexible logic circuit 13 are formed on the single flexible logic chip 130.

6.3 Actions/Effects

With such a configuration too, in an identical manner to the embodiments described above, based on the image data obtained by the image sensor 50, the parameters and the circuit configuration of the FPGA 131 can be modified to correct image deterioration. As a result, even when the image sensor 50 undergoes deterioration, it becomes possible to obtain accurate image data.

The remaining configuration, the remaining operations, and the remaining effects can be identical to the embodiments described above. Hence, the detailed explanation thereof is not repeated.

7. Sixth Embodiment

In the first to fifth embodiments described above, the image obtained by the image sensors 10, 20, 30, 40, and 50, respectively, is analyzed in the server 3 to identify the cause for deterioration; and, based on the identified cause for deterioration, updating data for the setting data and/or the circuit data of the FPGA 131 is generated in the server 3. In contrast, in a sixth embodiment, the explanation with reference to examples is given for a case in which analysis of the image data and generation of updating data is performed in the communication device.

7.1 Device Configuration

Figure 24:
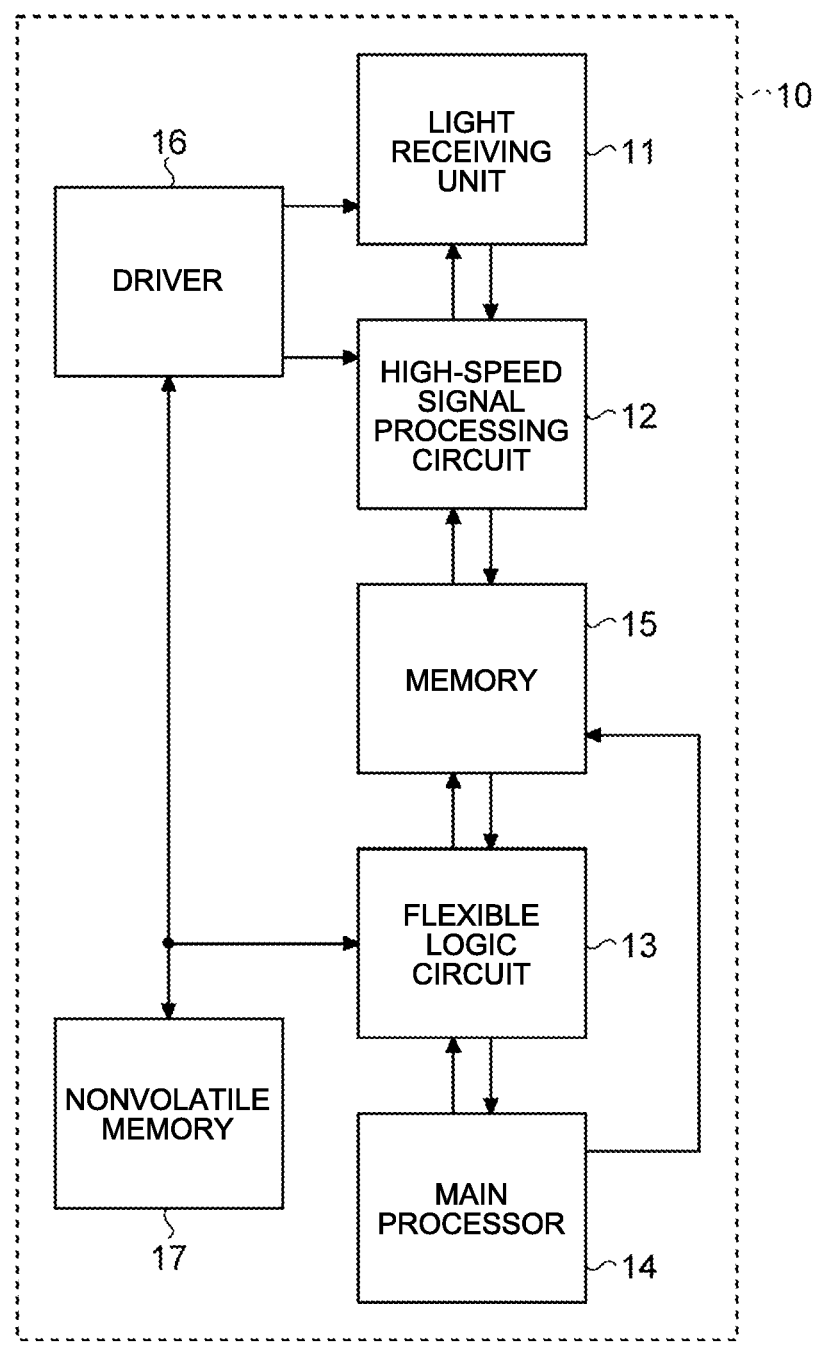
FIG. 24 is a block diagram illustrating an exemplary schematic configuration of a communication device according to a sixth embodiment.

FIG. 24 is a block diagram illustrating an exemplary schematic configuration of a communication device according to the sixth embodiment. As illustrated in FIG. 24, the image sensor 10 in the communication device according to the sixth embodiment has an identical configuration to, for example, the image sensor 10 explained with reference to FIG. 2 according to the first embodiment. However, in the sixth embodiment, for example, it is the main processor 14 that analyzes the processed image data stored in the memory 15, identifies the cause for deterioration, and accordingly generates updating data for the setting data and/or the circuit data of the FPGA 131. The updating data for the setting data and/or the circuit data is stored in the predetermined programmable memory area 152 of the memory 15 and is set in the FPGA 131, in an identical manner to the embodiments described above.

Meanwhile, in an identical manner to the server 3 according to the embodiments described above, the main processor 14 can be configured to generate a learnt model by performing machine learning of past data, and generate updating data for the setting data and/or the circuit data using the learnt model.

7.2 Modification Example of Device Configuration

Figure 25:
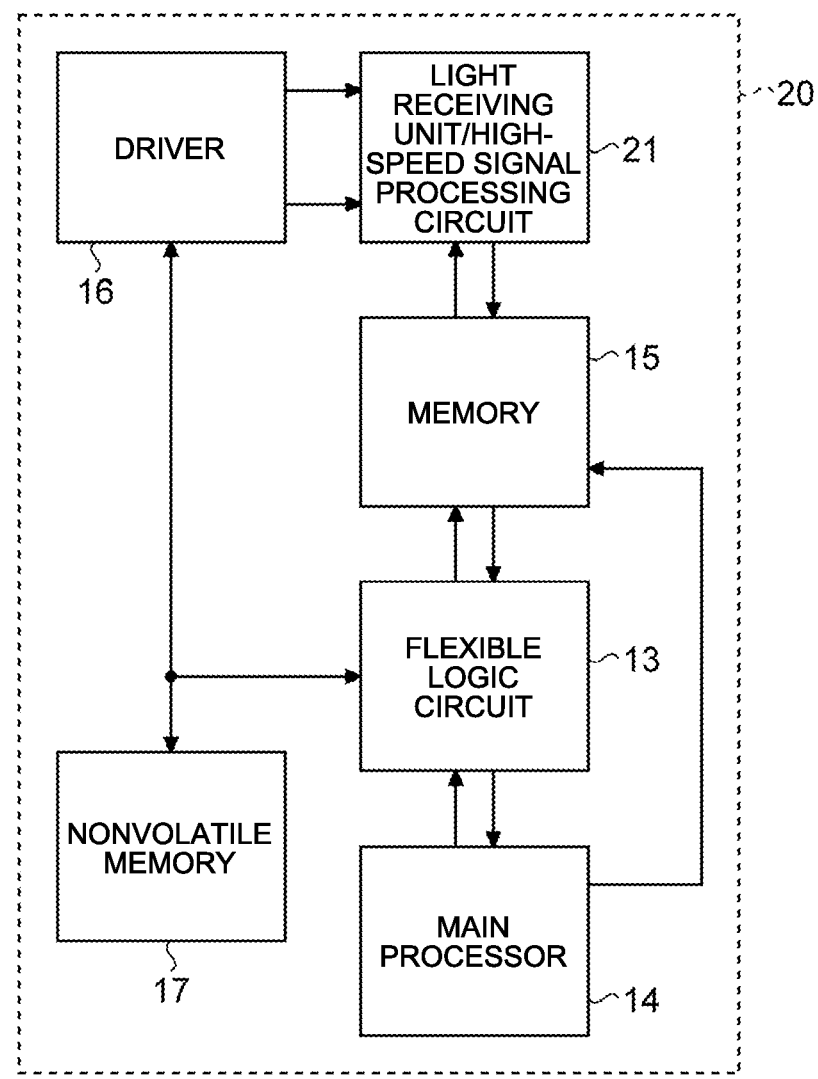
FIG. 25 is a block diagram illustrating another exemplary schematic configuration of the communication device according to the sixth embodiment.
Figure 26:
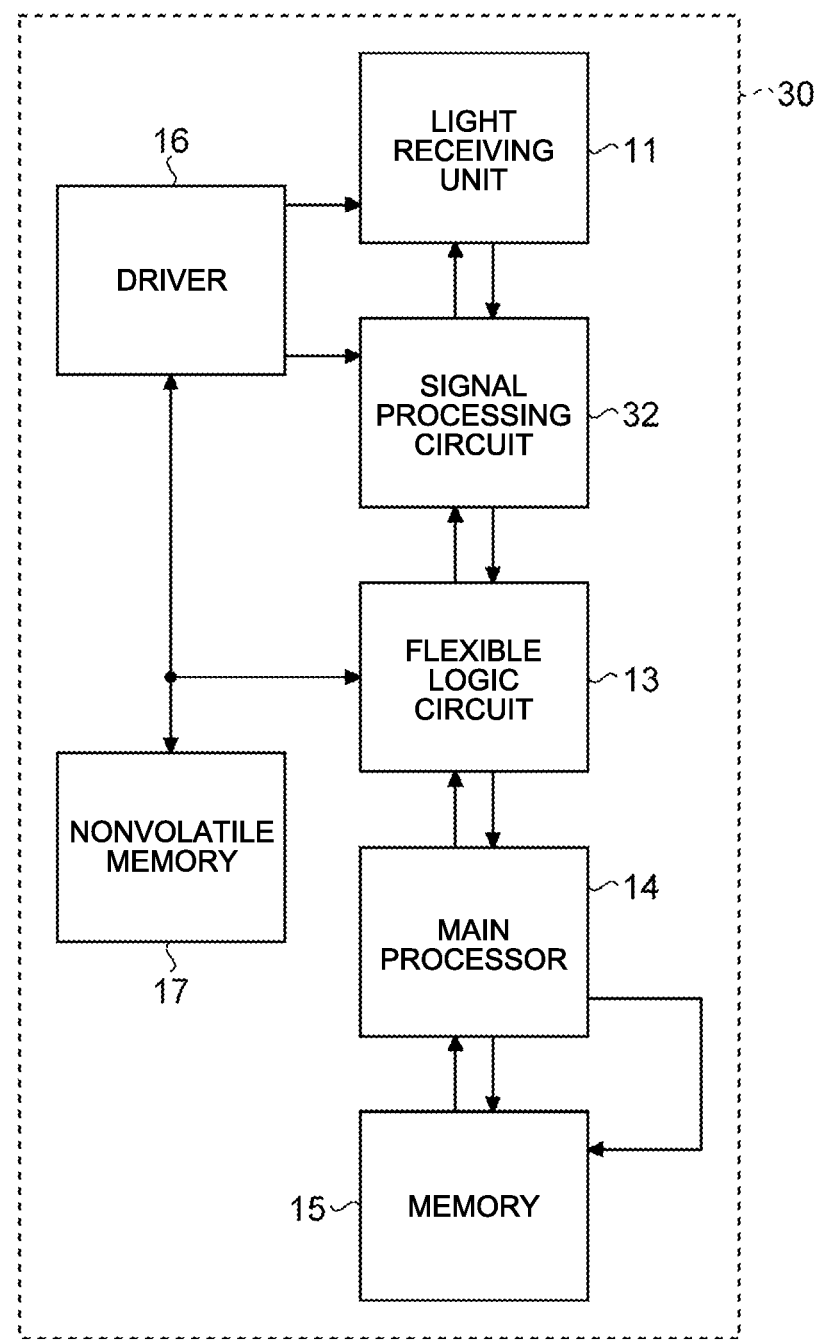
FIG. 26 is a block diagram illustrating still another exemplary schematic configuration of the communication device according to the sixth embodiment.
Figure 27:
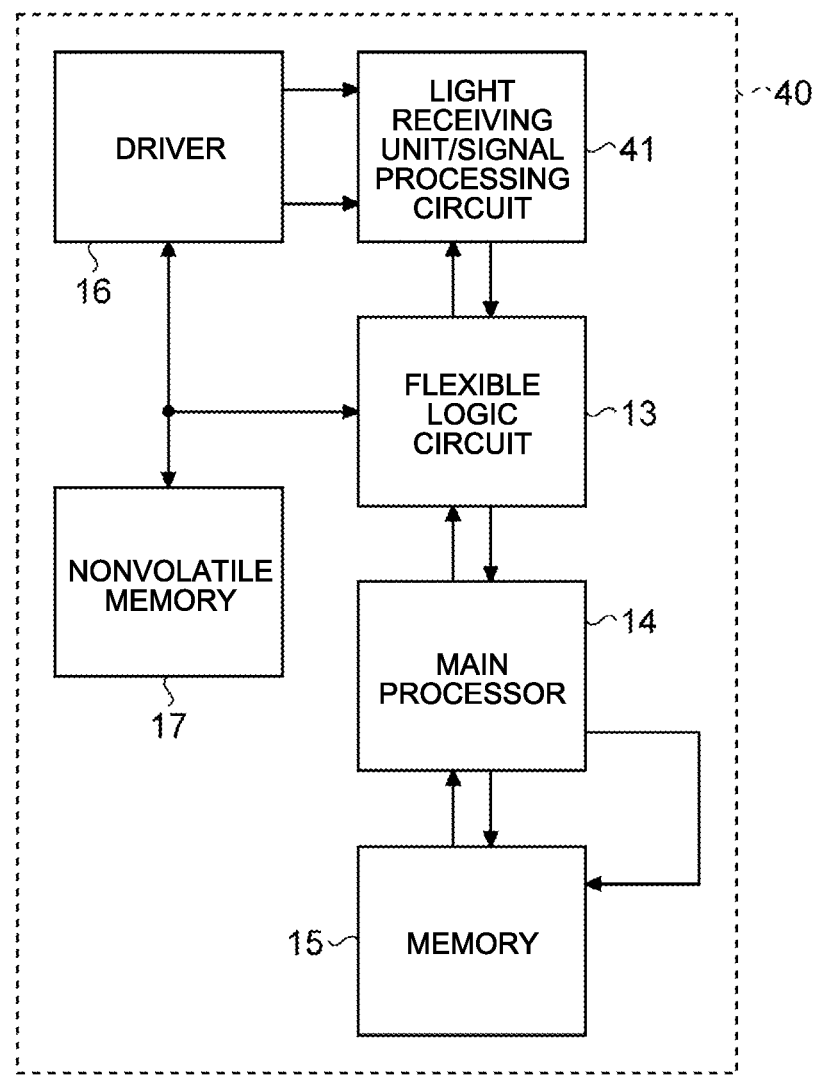
FIG. 27 is a block diagram illustrating still another exemplary schematic configuration of the communication device according to the sixth embodiment.
Figure 28:
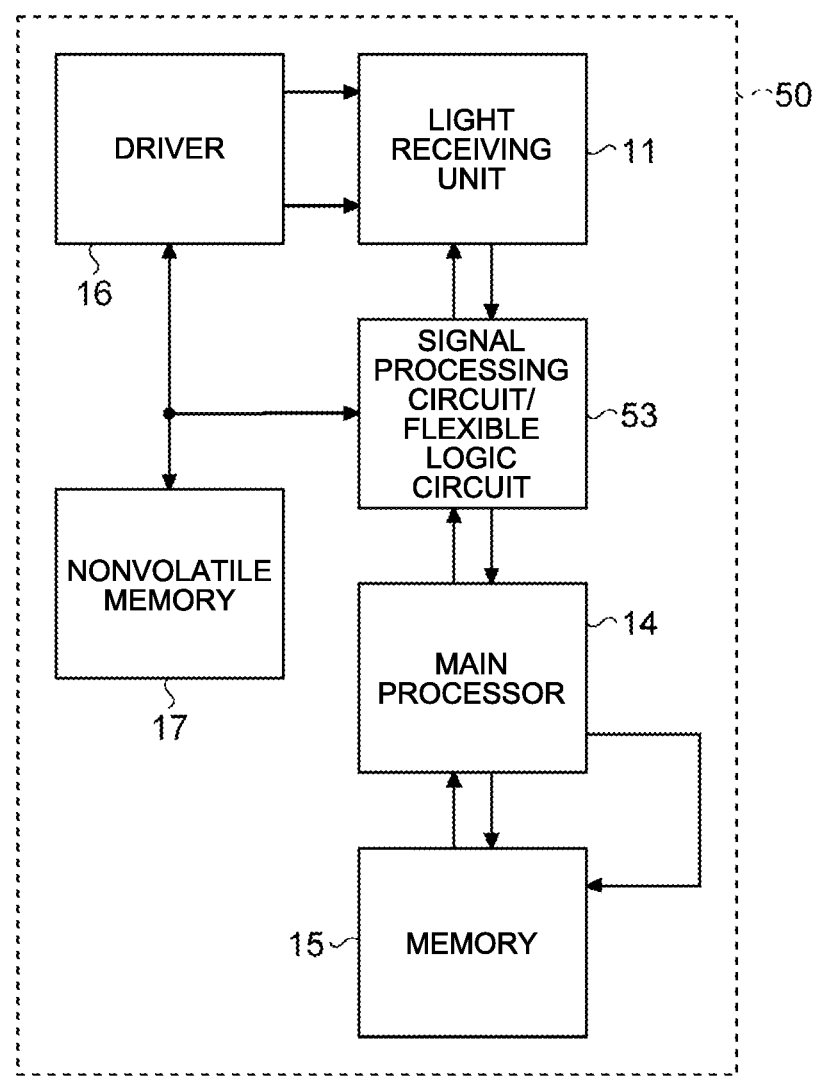
FIG. 28 is a block diagram illustrating still another exemplary schematic configuration of the communication device according to the sixth embodiment.

In FIG. 24 is illustrated a configuration that is based on the first embodiment. However, the configuration of the image sensor need not be based on the first embodiment. Alternatively, for example, the configuration can be based on the image sensor 20 according to the second embodiment as illustrated in FIG. 25; or the configuration can be based on the image sensor 30 according to the third embodiment as illustrated in FIG. 26; or the configuration can be based on the image sensor 40 according to the fourth embodiment as illustrated in FIG. 27; or the configuration can be based on the image sensor 50 according to the fifth embodiment as illustrated in FIG. 28.

7.3 Actions/Effects

In this way, even when the communication device is configured to perform the operations from analysis of image data to generation of updating data; in an identical manner to the embodiments described above, based on the image data obtained by any one of the image sensors 10, 20, 30, 40, and 50, the parameters and the circuit configuration of the FPGA 131 can be modified to correct image deterioration. As a result, even when the concerned image sensor from among the image sensors 10, 20, 30, 40, and 50 undergoes deterioration, it becomes possible to obtain accurate image data.

The remaining configuration, the remaining operations, and the remaining effects can be identical to the embodiments described above. Hence, the detailed explanation thereof is not repeated.

8. Seventh Embodiment

In the sixth embodiment described above, the main processor 14 generates a learnt model by performing machine learning, and generates updating data for the setting data and/or the circuit data using the learnt model. However, in the case in which the operations from analysis of image data to generation of updating data are performed in the communication device, a dedicated chip for performing machine learning can be installed in the communication device.

8.1 Device Configuration

Figure 29:
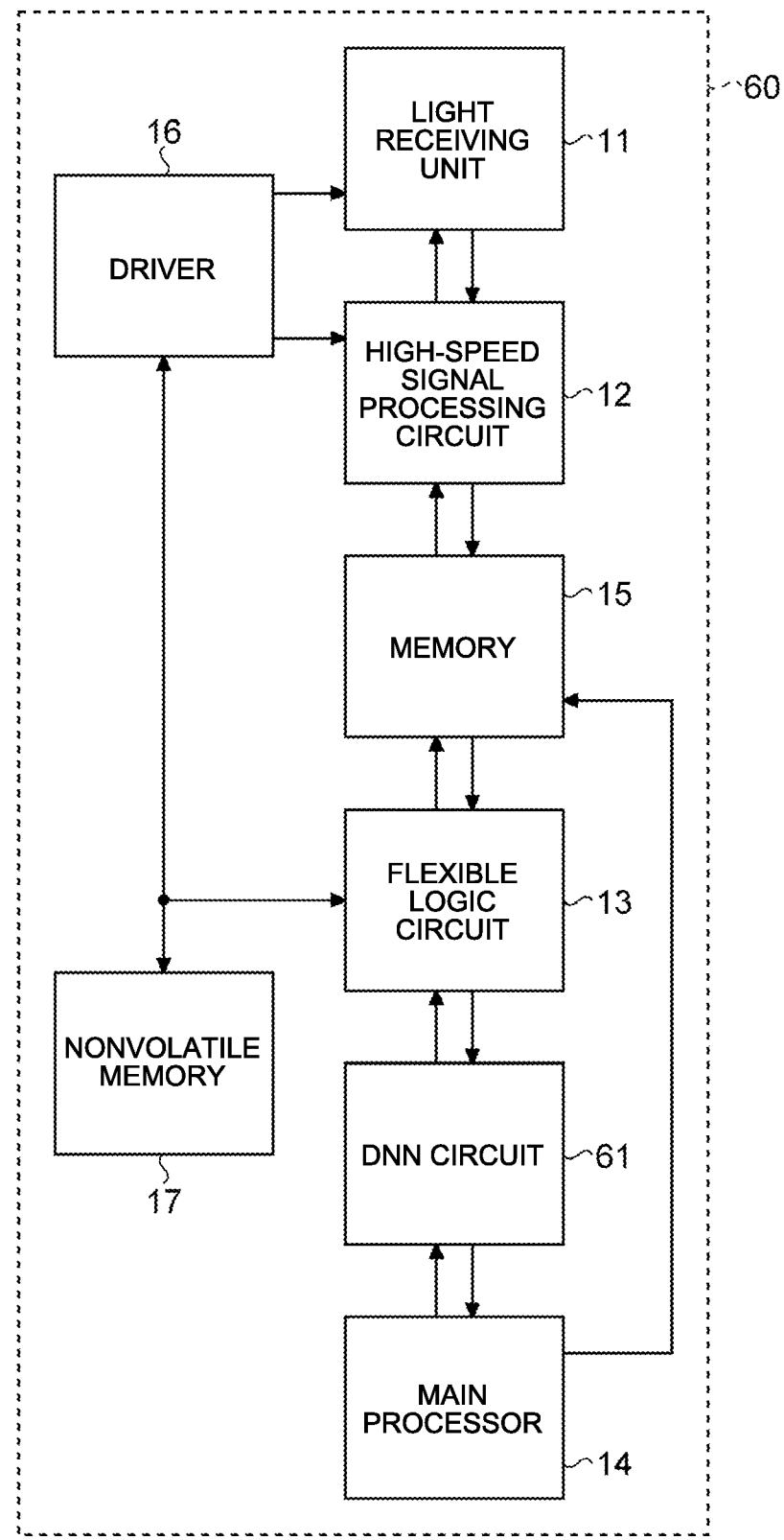
FIG. 29 is a block diagram illustrating an exemplary schematic configuration of a communication device according to a seventh embodiment.

FIG. 29 is a block diagram illustrating an exemplary schematic configuration of a communication device according to a seventh embodiment. As illustrated in FIG. 29, an image sensor 60 in the communication device according to the seventh embodiment is configured by, for example, adding a DNN (Deep Neural Network) circuit 61, which is meant for performing machine learning, to the configuration of the image sensor 10 explained with reference to FIG. 24. The DNN circuit 61 can be disposed, for example, in between the flexible logic circuit 13 and the main processor 14.

8.2 DNN Analysis Operation

Figure 30:
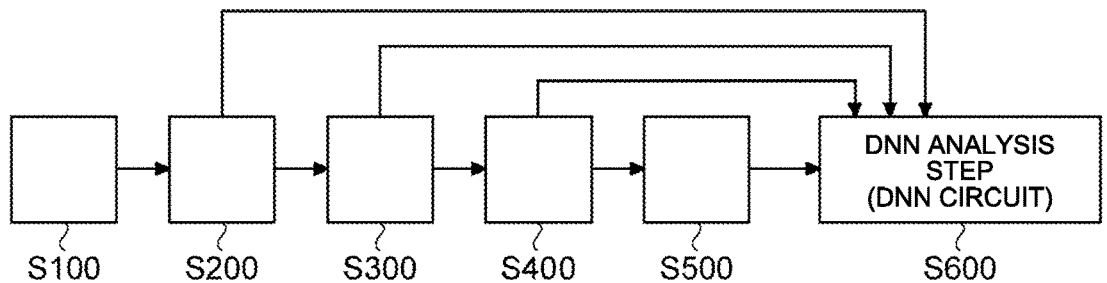
FIG. 30 is a diagram for explaining an example of a DNN analysis operation (a machine learning operation) according to the seventh embodiment.

FIG. 30 is a diagram for explaining an example of a DNN analysis operation (a machine learning operation) according to the seventh embodiment. As illustrated in FIG. 30, for example, from among the five stapes, namely, the photoelectric conversion step S100, the signal processing step S200, the base step S300, the control system step S400, and the picture formation step S500 explained with reference to FIG. 6 according to the first embodiment; the result of the operations at the signal processing step S200, the base step S300, the control system step S400, and the picture formation step S500 is input to the input layer of an DNN analysis step S600. In the DNN analysis step S600, regarding each edge that joins nodes (also called neurons) in each layer from the input layer to the output layer via hidden layers; the weight is obtained, and a learnt model is created for ensuring that the most suitable setting data and/or the most suitable circuit data for reducing deterioration in the image data appears in the output layer.

Using the learnt model created in the manner described above, the DNN circuit 61 and the main processor 14 generate updating data for the most suitable setting data and/or the most suitable circuit data for reducing deterioration in the image data, and store the updating data in the programmable memory area 152 of the memory 15.

8.3 Operation Flow

Figure 31:
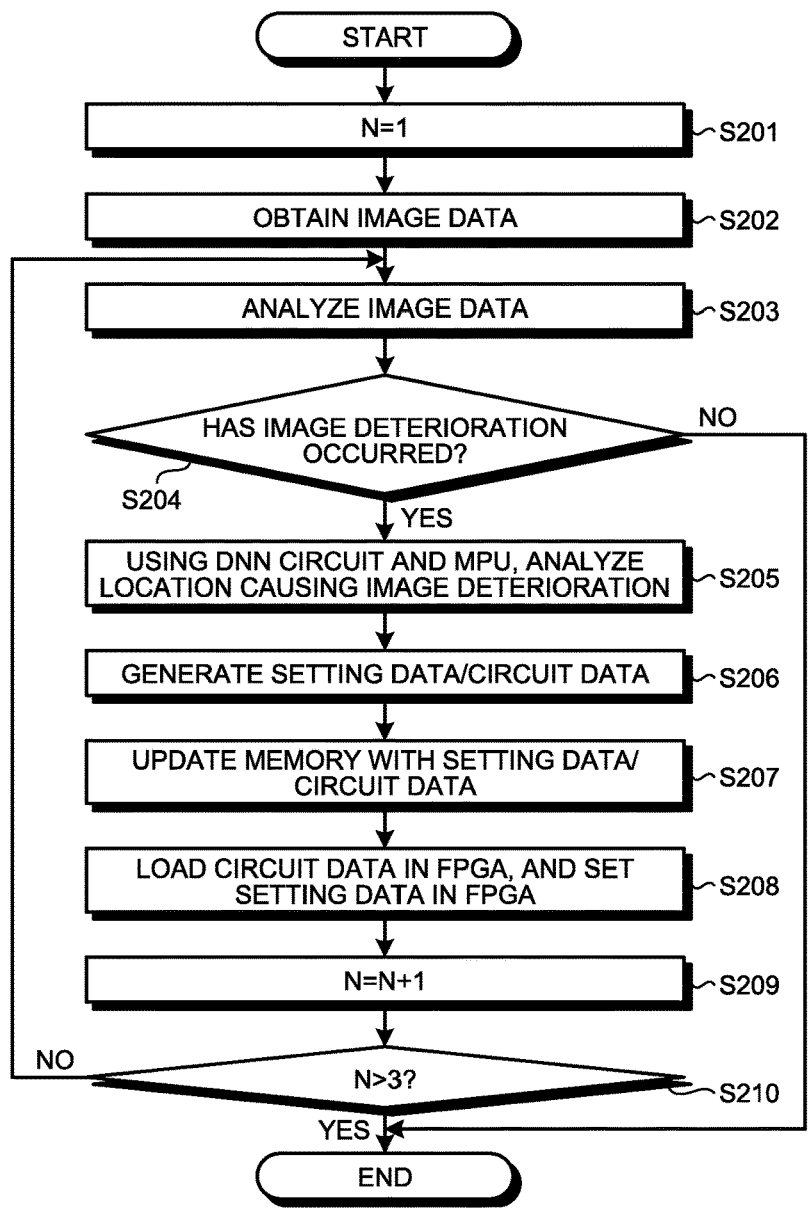
FIG. 31 is a flowchart for explaining an example of the overall operations performed according to the seventh embodiment.

Explained below with reference to a flowchart are the operations performed at the time of detecting and correcting the deterioration of the image sensor 60. FIG. 31 is a flowchart for explaining an example of the overall operations performed according to the seventh embodiment.

As illustrated in FIG. 31, in the present operations, firstly, the main processor 14 sets "1" in the value N meant for monitoring the repetition count of analysis (Step S201). Then, the main processor 14 controls the high-speed signal processing circuit 12 so that the image data is read from the light receiving unit 11 (Step S202).

Then, with respect to the obtained image data, the main processor 14 and the flexible logic circuit 13 perform operations at the steps illustrated in FIG. 6, and analyze the image data by inputting the result of the operation at each step to the DNN circuit 61 (Step S203). Then, based on the result of analysis, the main processor 14 determines whether or not there is image deterioration (Step S204).

If there is no image deterioration (NO at Step S204), then the main processor 14 ends the present operations. On the other hand, if there is image deterioration (YES at Step S204); then, based on the result of analysis obtained at Step S203, the main processor 14 and the DNN circuit 61 analyze the location causing image deterioration in the image sensor 60 (Step S205), and accordingly generate new setting data and/or new circuit data (Step S206).

Subsequently, the main processor 14 updates the setting data and/or the circuit data for the FPGA 131, which is stored in the programmable memory area 152 of the memory area 151, with the generated setting data and/or the generated circuit data (Step S207); and modifies the circuit configuration of the FPGA 131 by setting the updated setting data in the FPGA 131 and incorporating the updated circuit data in the FPGA 131 (Step S208). Meanwhile, in the case of updating the setting data for the actuator that drives the optical system of the light receiving unit 11 or updating the setting data for the constituent elements of the high-speed signal processing circuit 12, it is the predetermined parameters in the nonvolatile memory 17 that get updated by the setting data. With that, the driving of the constituent elements by the driver 16 gets adjusted.

Then, the main processor 14 increments the repetition count N by one (Step S209), and determines whether or not the incremented repetition count N is greater than the upper limit value of the repetition count (in this example, three) (Step S210). If the repetition count N is equal to or smaller than the upper limit value (NO at Step S210), then the system control returns to Step S202 and the main processor 14 performs the subsequent operations. On the other hand, if the repetition count N is greater than the upper limit value (YES at Step S210), then the main processor 14 ends the present operations.

8.4 Actions/Effects

In this way, by incorporating the DNN circuit 61 in the communication device, the operations from analyzing the image data to generating the updating data can be performed in the communication device based on machine learning. As a result, even when the concerned image sensor from among the image sensors 10, 20, 30, 40, and 50 undergoes deterioration, it becomes possible to obtain accurate image data.

Meanwhile, in the seventh embodiment, the explanation is given with reference to the image sensor 10 explained with reference to FIG. 24 according to the sixth embodiment. However, that is not the only possible case. Alternatively, the explanation can be given with reference to any one of the image sensors 20, 30, 40, and 50 explained with reference to FIGS. 25 to 28, respectively.

The remaining configuration, the remaining operations, and the remaining effects can be identical to the embodiments described above. Hence, the detailed explanation thereof is not repeated.

9. Eighth Embodiment

Of the embodiments described above, in the first to fifth embodiments, the explanation is given for the case in which the operations from analyzing the image data to generating the updating data are performed in the server 3. On the other hand, in the sixth embodiment, the explanation is given for the case in which the operations from analyzing the image data to generating the updating data are performed in the communication device. However, there is no restriction that only either one of the server 3 and the communication device is configured to perform the operations from analyzing the image data to generating the updating data.

Figure 32:
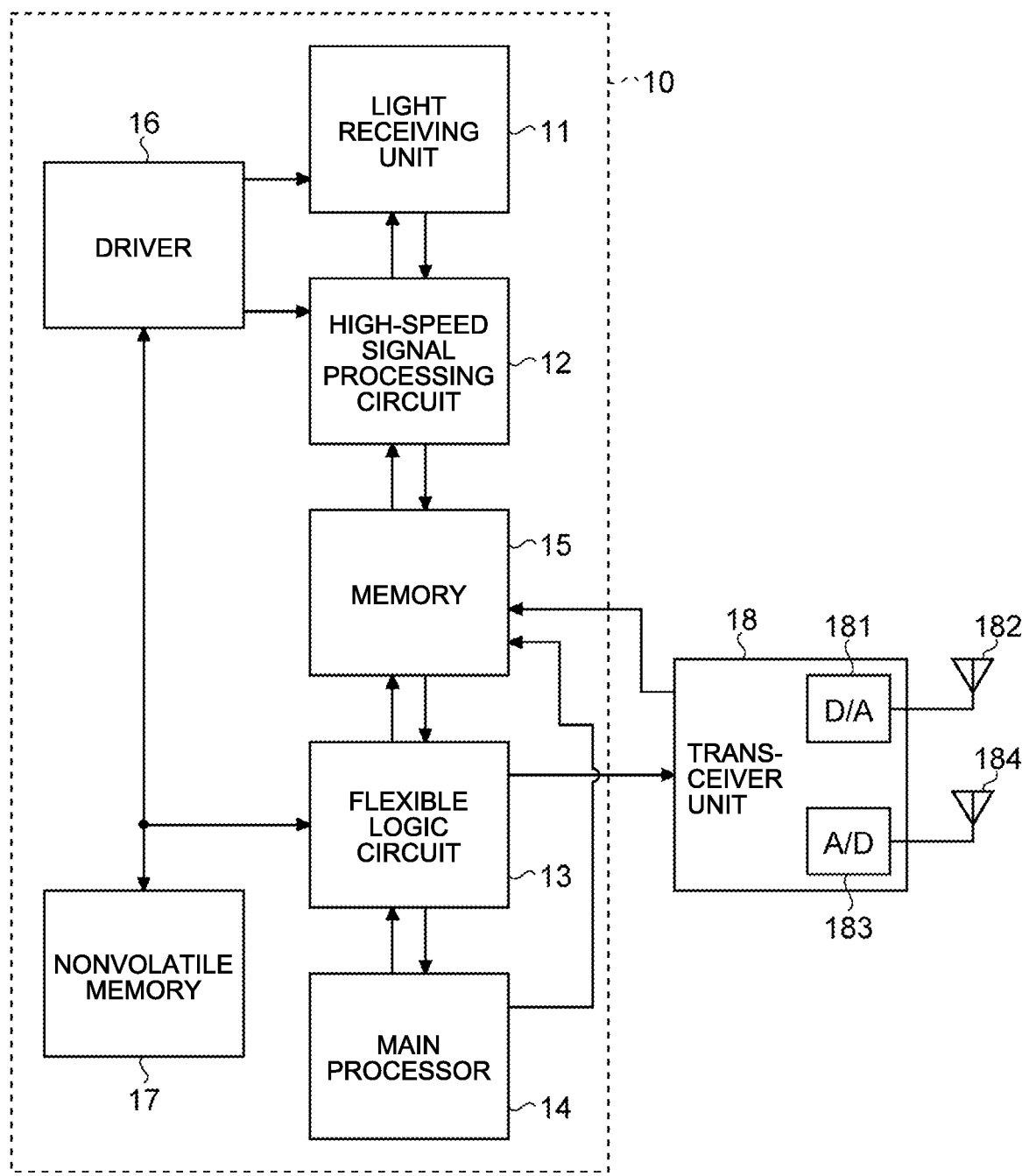
FIG. 32 is a block diagram illustrating an exemplary schematic configuration of a communication device according to an eighth embodiment.

For example, as illustrated in FIG. 32, either the server 3 or the communication device can be selected to be configured to perform the operations from analyzing the image data to generating the updating data.

For example, when the communication device is a mobile device such as a drone, an automobile, or an autonomous robot; it can be configured to perform the operations from analyzing the image data to generating the updating data while in motion. However, when the communication device is not in motion, the operations can be performed in the server 3.

Alternatively, from among the operations from analyzing the image data to generating the updating data, some operations are performed in the server 3 and some operations are performed in the communication device.

Regarding whether to perform the operations from analyzing the image data to generating the updating data in the server 3 or in the communication device 2, the switching can be performed in the main processor 14 or in an application processor (a switching unit) (not illustrated).

Meanwhile, in the eighth embodiment, the explanation is given with reference to the image sensor explained with reference to FIG. 2 according to the first embodiment and with reference to the image sensor 10 explained with reference to FIG. 24 according to the sixth embodiment. However, that is not the only possible case, and the explanation can be given also with reference to the other embodiments.

The remaining configuration, the remaining operations, and the remaining effects can be identical to the embodiments described above. Hence, the detailed explanation thereof is not repeated.

10. Application Examples

The technology disclosed in the application concerned can be applied in various products. For example, the technology disclosed in the application concerned can be implemented as a device that is mounted in any type of mobile object such as an automobile, an electrical vehicle, a hybrid electrical vehicle, a motorcycle, a bicycle, a personal mobility, an airplane, a drone, a marine vessel, a robot, a construction equipment, or an agricultural machine (a tractor).

Figure 33:
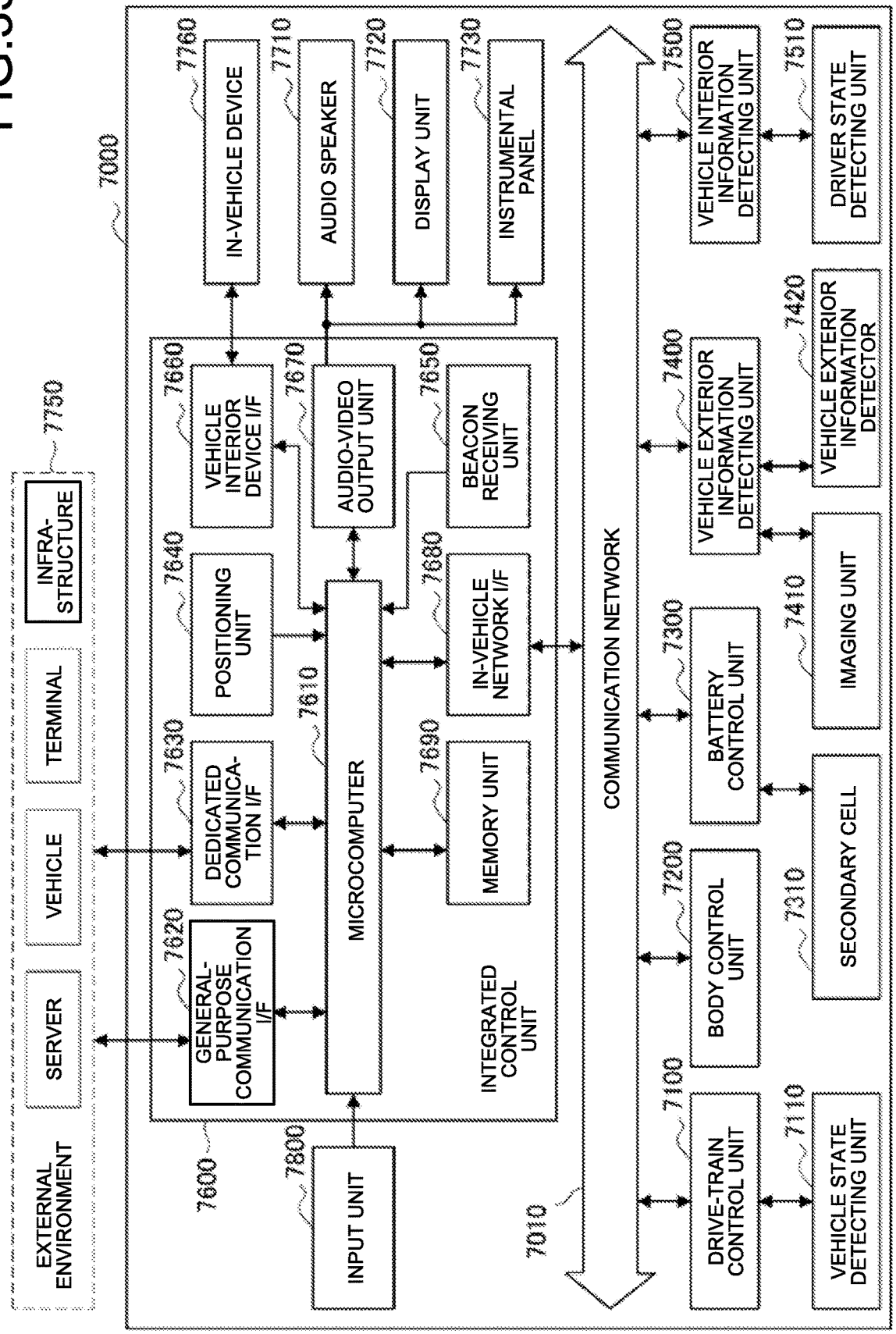
FIG. 33 is a block diagram illustrating an exemplary schematic configuration of a vehicle control system.

FIG. 33 is a block diagram illustrating an exemplary schematic configuration of a vehicle control system 7000 representing an example of a mobile object control system in which the technology disclosed in the application concerned is applicable. The vehicle control system 7000 includes a plurality of electronic control units that are connected to each other via a communication network 7010. In the example illustrated in FIG. 33, the vehicle control system 7000 includes a drive-train control unit 7100, a body control unit 7200, a battery control unit 7300, a vehicle exterior information detecting unit 7400, a vehicle interior information detecting unit 7500, and an integrated control unit 7600. The communication network 7010 that connects such a plurality of control units can be an in-vehicle communication network compatible to an arbitrary standard, such as a CAN (Controller Area network), a LIN (Local Interconnect Network), a LAN (Local Area Network), or FlexRay (registered trademark).

Each control unit includes a microcomputer for performing arithmetic processing according to various programs; a memory unit for storing the programs to be executed in the microcomputer and for storing the parameters to be used in a variety of arithmetic processing; and a drive circuit that drives various target devices for control. Moreover, each control unit includes a network I/F for performing communication with the other control units via the communication network 7010, and includes a communication I/F for performing wired communication or wireless communication with devices or sensors installed inside or outside the concerned vehicle. With reference to FIG. 33, a functional configuration of the integrated control unit 7600 includes a microcomputer 7610, a general-purpose communication I/F 7620, a dedicated communication I/F 7630, a positioning unit 7640, a beacon receiving unit 7650, a vehicle interior device I/F 7660, an audio-video output unit 7670, an in-vehicle network I/F 7680, and a memory unit 7690. In an identical manner, the other control units too include a microcomputer, a communication I/F, and a memory unit.

The drive-train control unit 7100 follows instructions from various programs and controls the operations of the devices related to the drive-train of the vehicle. For example, the drive-train control unit 7100 functions as a control device for the following: a drive force generating device, such as the internal-combustion engine or the drive motor, that generates the drive force of the vehicle; a drive force transmission mechanism that transmits the drive force to the wheels; a steering mechanism that adjusts the steering angle of the vehicle; and a braking device that generates the braking force of the vehicle. The drive-train control unit 7100 can also have the functions as a control device for the ABS (Antilock Brake System) or the ESC (Electronic Stability Control).

To the drive-train control unit 7100, a vehicle state detecting unit 7110 is connected. The vehicle state detecting unit 7110 includes, for example, at least either a gyro sensor for detecting the angular velocity of the shaft rotation movement of the vehicle body; or an accelerator sensor for detecting acceleration of the vehicle; or a sensor for detecting the amount of operation of the acceleration pedal, detecting the amount of operation of the brake pedal, detecting the angle of steering of the steering wheel, or detecting the engine speed or the wheel revolution speed. The drive-train control unit 7100 performs arithmetic operations using the signals input from the vehicle state detecting unit 7110, and controls the internal-combustion engine, the drive motor, the electronic power steering device, and the braking device.

The body control unit 7200 follows instructions from various programs and controls the operations of various devices that are fit in the vehicle body. For example, the body control unit 7200 functions as a keyless entry system; a smart key system; an automatic-window device; and a control device for various lamps such as the headlamps, the tail lamps, the brake lamps, the turn signal lamps, and the fog lamps. In that case, the body control unit 7200 can receive input of the radio waves transmitted from a portable device substituting the key and receive input of signals of various switches. Upon receiving the input of the radio waves or the signals, the body control unit 7200 controls the door lock device, the automatic-window device, and the lamps of the vehicle.

The battery control unit 7300 follows instructions from various programs and controls a secondary cell 7310 representing the power supply source for the drive motor. For example, to the battery control unit 7300, information such as the battery temperature, the battery output voltage, and the remaining battery capacity is input from a battery device that includes the secondary cell 7310. The battery control unit 7300 performs arithmetic processing using such signals, and controls the temperature adjustment of the secondary cell 7310 and controls the cooling device installed in the battery device.

The vehicle exterior information detecting unit 7400 detects the information on the outside of the vehicle in which the vehicle control system 7000 is installed. For example, to the vehicle exterior information detecting unit 7400, at least either an imaging unit 7410 or a vehicle exterior information detector 7420 is connected. The imaging unit 7410 includes at least either one of a ToF (Time of Flight) camera, a stereo camera, a monocular camera, an infrared camera, and some other camera. The vehicle exterior information detector 7420 includes, for example, at least either an environment sensor for detecting the current weather conditions or meteorological phenomena, or a surrounding information detection sensor for detecting surrounding vehicles, obstacles, and pedestrians around the vehicle in which the vehicle control system 7000 is installed.

The environment sensor can be, for example, at least either a raindrop sensor for detecting the rainy weather, or a fog sensor for detecting the fog, a sunlight sensor for detecting the amount of sunlight, or a snowfall sensor for detecting the snowfall. The surrounding information detection sensor can be at least one of an ultrasonic sensor, a radar device, and a LIDAR (Light Detection and Ranging, Laser Imaging Detection and Ranging) device. The imaging unit 7410 and the vehicle exterior information detector 7420 can be included as independent sensors or devices, or can be included as a device formed by integrating a plurality of sensors and devices.

Figure 34:
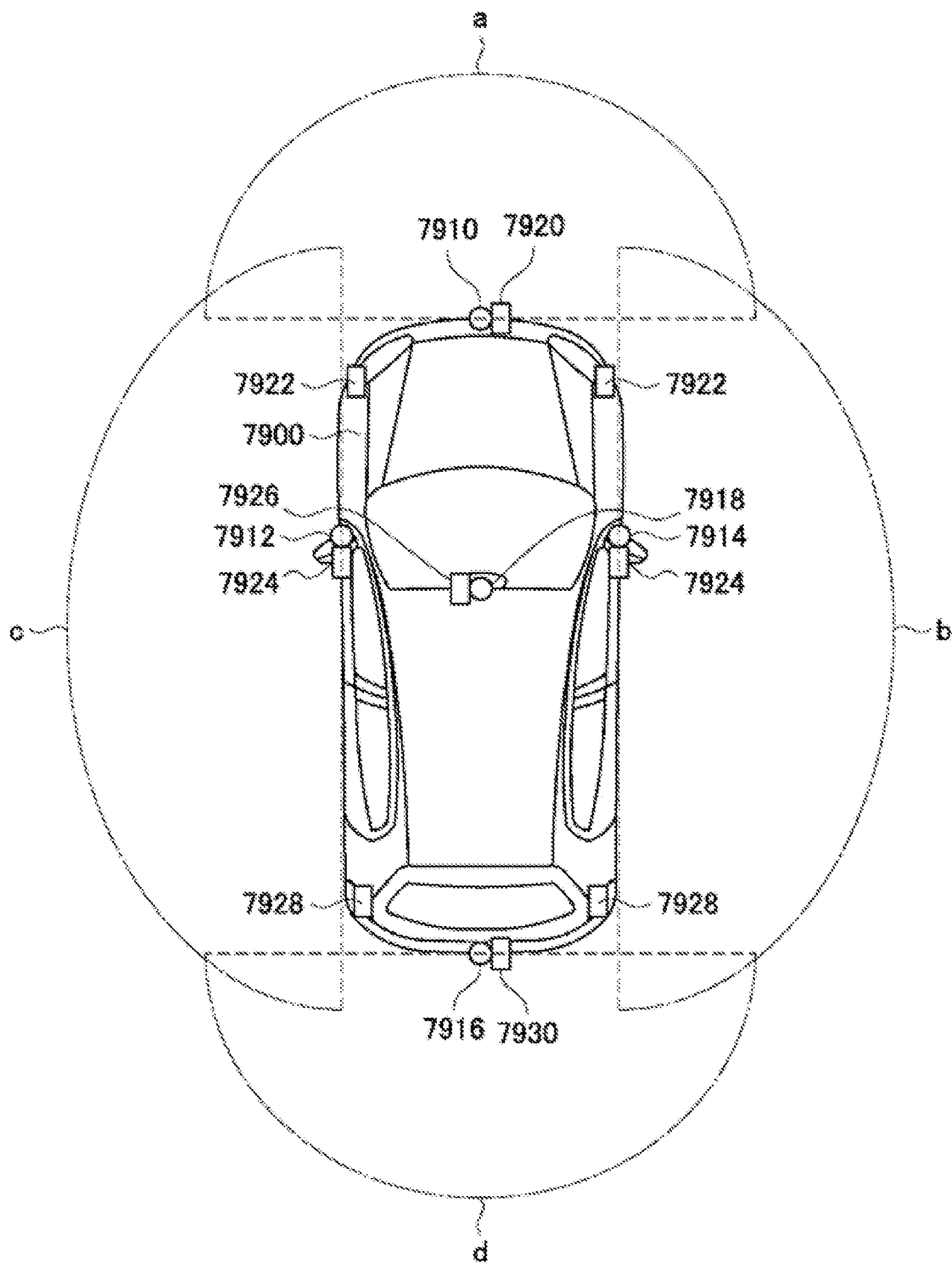
FIG. 34 is an explanatory diagram illustrating an example of the installation positions of a vehicle exterior information detector and imaging units.

In FIG. 34 is illustrated an example of the installation positions of the imaging unit 7410 and the vehicle exterior information detector 7420. Herein, for example, imaging units 7910, 7912, 7914, 7916, and 7918 are installed at least at the front nose, rearview mirrors, the rear bumper, back doors, and the upper part of the windshield on the vehicle interior. The imaging unit 7910 installed at the front nose and the imaging unit 7918 installed in the upper part of the windshield on the vehicle interior mainly obtain the images of the anterior side of a vehicle 7900. The imaging units 7912 and 7914 installed on the rearview mirrors mainly obtain the images of the sides of the vehicle 7900. The imaging unit 7916 installed on the rear bumper or on a back door mainly obtains the images of the posterior side of the vehicle 7900. The imaging unit 7918 installed in the upper part of the windshield on the vehicle interior is mainly used in the detection of leading vehicles, pedestrians, obstacles, traffic lights, traffic signs, and traffic lanes.

Meanwhile, in FIG. 34 is illustrated an example of the imaging range of each of the imaging units 7910, 7912, 7914, and 7916. An imaging range "a" represents the imaging range of the imaging unit 7910 installed on the front nose; imaging ranges "b" and "c" represent the imaging ranges of the imaging units 7912 and 7914, respectively, installed on the rearview mirrors; and an imaging range "d" represents the imaging range of the imaging unit 7916 installed on the rear bumper or a back door. For example, if the image data obtained by imaging by the imaging units 7910, 7912, 7914, and 7916 is superimposed; an overhead image is obtained in which the vehicle 7900 is seen from above.

In the vehicle 7900, vehicle exterior information detectors 7920, 7922, 7924, 7926, 7928, and 7930 that are installed at the front side, the rear side, the lateral sides, the corners, and the upper part of the windshield in the vehicle interior can be, for example, ultrasonic sensors or radar devices. The vehicle exterior information detectors 7920, 7926, and 7930 that are installed at the front nose, the rear bumper, the back doors, and the upper part of the windshield on the vehicle interior can be, for example LIDAR devices. These vehicle exterior information detectors 7920 to 7930 are mainly used in the detection of leading vehicles, pedestrians, and obstacles.

Returning to the explanation with reference to FIG. 33, the vehicle exterior information detecting unit 7400 makes the imaging unit 7410 take images of the vehicle exterior, and receives the image data of the taken images. Moreover, the vehicle exterior information detecting unit 7400 receives detection information from the vehicle exterior information detector 7420 connected thereto. If the vehicle exterior information detector 7420 is an ultrasonic sensor, a laser device, or a LIDAR device; the vehicle exterior information detecting unit 7400 transmits ultrasonic waves or electromagnetic waves, and receives information about the reflected waves. Then, based on the received information, the vehicle exterior information detecting unit 7400 can perform an object detection operation or a distance detection operation for detecting persons, vehicles, obstacles, traffic signs, and on-road characters. Moreover, based on the received information, the vehicle exterior information detecting unit 7400 can perform an environment recognition operation for recognizing rainfall, fog, and road conditions. Furthermore, based on the received information, the vehicle exterior information detecting unit 7400 can calculate the distance to the objects present on the outside of the vehicle.

Moreover, based on the received information, the vehicle exterior information detecting unit 7400 can perform an image recognition operation or a distance detection operation for recognizing persons, vehicles, obstacles, traffic signs, and on-road characters. Furthermore, the vehicle exterior information detecting unit 7400 can perform operations such as distortion correction or position adjustment with respect to the received image data; synthesize the image data obtained by imaging by different imaging units 7410; and generate an overhead image or a panoramic image. Moreover, the vehicle exterior information detecting unit 7400 can perform a viewpoint conversion operation using the image data obtained by imaging by different imaging units 7410.

The vehicle interior information detecting unit 7500 detects the information about the inside of the vehicle. For example, to the vehicle interior information detecting unit 7500 is connected a driver state detecting unit 7510 that detects the state of the driver. The driver state detecting unit 7510 can include a camera for taking images of the driver, a biological sensor for detecting the biological information of the driver, and a microphone for collecting the sounds inside the vehicle. The biological sensor is disposed in, for example, the seat and the steering wheel, and detects the biological information of the person sitting in the seat or the driver holding the steering wheel. Based on the detection information input from the driver state detecting unit 7510, the vehicle interior information detecting unit 7500 can calculate the degree of tiredness or the degree of concentration of the driver, or can determine whether the driver is asleep at the wheel. Moreover, the vehicle interior information detecting unit 7500 can perform operations such as noise cancelling with respect to the collected sound signals.

The integrated control unit 7600 follows instructions from various programs and controls the overall operations performed in the vehicle control system 7000. To the integrated control unit 7600, an input unit 7800 is connected. For example, the input unit 7800 is implemented using devices such as a touch-sensitive panel, buttons, a microphone, switches, or levers that are operable by the passengers. To the integrated control unit 7600, data can be input that is obtained as a result of performing voice recognition of the voice input from a microphone. The input unit 7800 can be, for example, a remote control device in which infrared rays or some other radio waves are used, or an external connection device such as a cellular phone or a PDA (Personal Digital Assistant) compatible with the operations of the vehicle control system 7000. Alternatively, for example, the input unit 7800 can be a camera, and the passengers can input information using gestures. Still alternatively, data can be input that is obtained by detecting the movements of the wearable devices being worn by the passengers. Moreover, the input unit 7800 can include, for example, an input control circuit that generates input signals based on the information input by the passengers from the input unit 7800, and outputs the input signals to the integrated control unit 7600. The passengers operate the input unit 7800, and input a variety of data and instruct operations to the vehicle control system 7000.

The memory unit 7690 can include a ROM (Read Only Memory) used to store various programs to be executed by the microcomputer, and a RAM (Random Access Memory) used to store various parameters, computational results, and sensor values. The memory unit 7690 can be implemented using a magnetic memory device such as an HDD (Hard Disc Drive), or a semiconductor memory device, or an optical memory device, or a magneto-optical memory device.

The general-purpose communication I/F 7620 is a general-purpose communication I/F for relaying communication with various devices present in an external environment 7750. The general-purpose communication I/F 7620 can be installed with a cellular communication protocol such as GSM (registered trademark) (Global System of Mobile Communications), WiMAX (registered trademark), LTE (registered trademark) (Long Term Evolution), or LTE-A (LTE-Advanced); or can be installed with some other wireless communication protocol such as a wireless LAN (also called Wi-Fi (registered trademark)) or Bluetooth (registered trademark). Moreover, the general-purpose communication I/F 7620 can establish connection with devices (for example, application servers and control servers) present in an external network (for example, the Internet, a cloud network, or a network dedicated to business operators) via, for example, a base station or an access point. Furthermore, the general-purpose communication I/F 7620 can establish connection with terminals present in the vicinity of the vehicle (for example, terminals in possession of the driver, pedestrians, and shops) or with MTC (Machine Type Communication) terminals using, for example, the P2P (Peer to Peer) technology.

The dedicated communication I/F 7630 is a communication I/F that supports a communication protocol developed for the use in vehicles. For example, the dedicated communication I/F 7630 can implement WAVE (Wireless Access in Vehicle Environment) or DSRC (Dedicated Short Range Communications) representing a combination of IEEE 802.11p for lower layers and IEEE 1609 for upper layers; or can implement a standard protocol such as a cellular communication protocol. Typically, the dedicated communication I/F 7630 carries out V2X communication that is a concept including one or more of vehicle to vehicle communication, vehicle to infrastructure communication, vehicle to home communication, and vehicle to pedestrian communication.

The positioning unit 7640 performs positioning by receiving GNSS signals from GNSS satellites (GNSS stands for Global Navigation Satellite System) (for example, GPS signals from GPS satellites (GPS stands for Global Positioning System)); and generates location information containing the latitude, the longitude, and the altitude of the vehicle. The positioning unit 7640 can identify the current location by exchanging signals with wireless access points, or can obtain location information from a terminal such as a cellular phone, a PHS, or a smartphone having the positioning function.

The beacon receiving unit 7650 receives the radio waves or the electromagnetic waves transmitted from the wireless stations installed on the roads; and obtains information such as the current location, congestion, road closure, and the required time. Meanwhile, the functions of the beacon receiving unit 7650 can alternatively be included in the dedicated communication I/F 7630.

The vehicle interior device I/F 7660 is a communication interface for relaying the connection between the microcomputer 7610 and various in-vehicle devices 7760 present in the vehicle. The vehicle interior device I/F 7660 can establish a wireless connection using a wireless communication protocol such as a wireless LAN, Bluetooth (registered trademark), NFC (Near Field Communication), or WUSB (Wireless USB). Alternatively, the vehicle interior device I/F 7660 can establish a wired connection such as USB (Universal Serial Bus), HDMI (registered trademark) (High-Definition Multimedia Interface), or MHL (Mobile High-definition Link) via a connection terminal (not illustrated) (and a cable if necessary). For example, the in-vehicle devices 7760 can include at least one of the following: mobile devices or wearable devices in possession of the passengers, and information devices carried in or attached to the vehicle. Moreover, the in-vehicle devices 7760 can include a navigation device for searching the routes to an arbitrary destination. The vehicle interior device I/F 7660 exchanges control signals or data signals with the in-vehicle devices 7760.

The in-vehicle network I/F 7680 is an interface for relaying communication with the microcomputer 7610 and the communication network 7010. The in-vehicle network I/F 7680 sends and receives signals according to a predetermined protocol supported by the communication network 7010.

The microcomputer 7610 of the integrated control unit 7600 controls the vehicle control system 7000 according to various protocols and based on the information obtained via at least one of the general-purpose communication I/F 7620, the dedicated communication I/F 7630, the positioning unit 7640, the beacon receiving unit 7650, the vehicle interior device I/F 7660, and the in-vehicle network I/F 7680. For example, based on the obtained information about the inside and the outside of the vehicle, the microcomputer 7610 can calculate control target values of the drive force generating device, the steering mechanism, and the control device; and can output control instructions to the drive-train control unit 7100. For example, the microcomputer 7610 can perform coordinated control with the aim of implementing the functions of the ADAS (Advanced Driver Assistance System) that includes collision avoidance and impact mitigation of the vehicle, follow-travel based on the inter-vehicle distance, speed-maintained travel, warning against collision of vehicles, and warning against lane departure. Moreover, the microcomputer 7610 can control the drive force generating device, the steering mechanism, and the braking device based on the information about the surrounding of the vehicle, and can perform coordinated control with the aim of implementing the self-driving mode in which the vehicle travels in an autonomous manner without the operations of the driver.

The microcomputer 7610 can generate three-dimensional distance information between the vehicle and surrounding objects, such as structures and persons, based the information obtained via at least one of the general-purpose communication I/F 7620, the dedicated communication I/F 7630, the positioning unit 7640, the beacon receiving unit 7650, the vehicle interior device I/F 7660, and the in-vehicle network I/F 7680; and can crate local map information containing the surrounding information of the present location of the vehicle. Moreover, based on the obtained information, the microcomputer 7610 can predict hazards such as collision of vehicles, proximity to pedestrians, or entry into a road having road closure; and can generate warning signals. The warning signals can be, for example, the signals for generating a warning sound or activating a warning lamp.

The audio-video output unit 7670 sends output signals of at least either an audio or a video to output devices capable of notifying the passengers in the vehicle or notifying the outside of the vehicle about information in a visual or auditory manner. In the example illustrated in FIG. 33, an audio speaker 7710, a display unit 7720, and an instrumental panel 7730 are illustrated as the output devices. The display unit 7720 can include, for example, at least either an onboard display or a head-up display. Moreover, the display unit 7720 can also include the AR (Augmented Reality) display function. Apart from such examples, an output device can be a wearable device such as headphones or a spectacle-type display used by the passengers, or can be some other device such as a projector or a lamp. When the output device is a display device, the result of various operations performed by the microcomputer 7610 and the information received from other control units is displayed by the display device in various visual forms such as texts, images, tables, and graphs. When the output device is an audio output device; it converts audio signals, which are made of reproduced audio data or acoustic data, into analog signals, and outputs them in an auditory manner.

In the example illustrated in FIG. 33, of the control units connected via the communication network 7010, at least two control units can be integrated into a single control unit. Alternatively, individual control units can be configured using a plurality of control units. Moreover, the vehicle control system 7000 can include some other control units (not illustrated). Furthermore, in the explanation given above, some or all of the functions of any control unit can be provided in another control unit. That is, as long as the information can be received and sent via the communication network 7010, predetermined arithmetic processing can be performed in any control units. In an identical manner, the sensors or the devices that are connected to a control unit can be connected to another control unit, and a plurality of control units can send detection information to and receive detection information from each other via the communication network 7010.

Meanwhile, a computer program meant for implementing the functions of the sensor system 1 explained with reference to FIG. 1 according to the embodiments can be installed in any control unit. Moreover, a computer-readable recording medium can be provided in which the computer program is stored. Examples of the recording medium include a magnetic disk, an optical disk, a magneto-optical disk, and a flash memory. Alternatively, instead of using a recording medium, the computer program can be, for example, distributed via a network.

In the vehicle control system 7000, the communication device 2 explained with reference to FIG. 2 according to the embodiments can be implemented in the integrated control unit 7600 representing the application example illustrated in FIG. 33. For example, of the communication device 2; the main processor 14, the memory 15, and the transceiver unit 18 are equivalent to the microcomputer 7610, the memory unit 7690, and the in-vehicle network I/F 7680 of the integrated control unit 7600.

Meanwhile, at least some constituent elements of the communication device 2 explained with reference to FIG. 2 can be implemented in a module for the integrated control unit 7600 illustrated in FIG. 33 (for example, an integrated circuit module configured using a single die). Alternatively, the sensor system 1 explained with reference to FIG. 1 can be implemented using a plurality of control units of the vehicle control system 7000 illustrated in FIG. 33.

Although the application concerned is described above in detail in the form of embodiments with reference to the accompanying drawings; the technical scope of the application concerned is not limited to the embodiments described above. That is, the application concerned is to be construed as embodying all modifications such as other embodiments, additions, alternative constructions, and deletions that may occur to one skilled in the art that fairly fall within the basic teaching herein set forth.

The effects described in the embodiments of the present written description are only explanatory and exemplary, and are not limited in scope. That is, the technology disclosed in the application concerned enables achieving other effects that may occur to one skilled in the art.

Meanwhile, a configuration as explained below also drops within the technical scope of the application concerned.

(1)

A sensor device comprising:
a sensor that obtains sensor information;
an FPGA (Field-Programmable Gate Array) that performs predetermined processing on the sensor information obtained by the sensor; and
a memory that is used to store data, which is to be used in making the FPGA perform the predetermined processing.

(2)

The sensor device according to (1), wherein the data stored in the memory is updated according to result of analysis of the sensor information.

(3)

The sensor device according to (1) or (2), further comprising:
a sending unit that sends the sensor information, which has been subjected to the predetermined processing, to a predetermined network; and
a receiving unit that receives updating data, which is to be used in updating the FPGA and which is generated according to result of analysis of the sensor information sent to the predetermined network, wherein
the data stored in the memory is updated with the updating data.

(4)

The sensor device according to (3), wherein
the sending unit sends the sensor information to a predetermined network using wireless communication, and
the receiving unit receives the updating data from the predetermined network using wireless communication.

(5)

The sensor device according to (4), further comprising:
an encoding unit that encodes the sensor information; and
a decoding unit that removes encoding of the updating data.

(6)

The sensor device according to (1) or (2), further comprising a processor that
analyzes the sensor information,
generates updating data to be used in updating the FPGA according to result of analysis, and
updates the data, which is stored in the memory, with the generated updating data.

(7)

The sensor device according to (6), further comprising a DNN (Deep Neural Network) circuit that analyzes sensor information by performing machine learning, wherein
the processor analyzes the sensor information based on result of the machine learning performed by the DNN circuit.

(8)

The sensor device according to (1) or (2), further comprising:
a sending unit that sends the sensor information, which has been subjected to the predetermined processing, to a predetermined network;
a receiving unit that receives updating data, which is to be used in updating the FPGA and which is generated according to result of analysis of the sensor information sent to the predetermined information;
a processor that analyzes the sensor information and generates updating data to be used in updating the FPGA according to result of the analysis; and
a switching unit that switches between sending the sensor information to the predetermined network using the sending unit and inputting the sensor information to the processor, wherein
the data stored in the memory is updated either with the updating data received by the receiving unit or with the updating data generated by the processor.

(9)

The sensor device according to any one of (1) to (8), wherein
the sensor information represents image data, and
the sensor includes
a light receiving unit having a plurality of photoelectric conversion elements, and
a signal processing circuit that reads image data from the light receiving unit.

(10)

The sensor device according to (9), wherein the predetermined processing includes at least one of black level processing, defect correction, shading correction, distortion correction, automatic exposure/automatic focusing/automatic white balance adjustment, synchronization, linear matrix processing, gamma correction, luminance-color separation, edge reinforcement, color difference matrix processing, and resizing/zooming.

(11)

The sensor device according to any one of (1) to (10), wherein the data contains
circuit data to be used in incorporating a circuit configuration, which performs the predetermined processing, in the FPGA, and
setting data containing parameters to be set in the circuit configuration.

(12)

The sensor device according to (1) or (2), further comprising a processor that performs the predetermined processing in coordination with the FPGA.

(13)

The sensor device according to any one of (1) to (12), further comprising:
a first chip that has the sensor installed thereon;
a second chip that has the FPGA installed thereon; and
a third chip that has the memory installed thereon, wherein
the sensor device has a stack structure formed by stacking the first chip to the third chip.

(14)

The sensor device according to (13), wherein the third chip is positioned in between the first chip and the second chip.

(15)

The sensor device according to (13) or (14), further comprising a fourth chip that has a processor installed thereon for performing the predetermined processing in coordination with the FPGA, wherein
the stack structure is formed by stacking the first chip to the fourth chip.

(16)
The sensor device according to (15), wherein
the first chip is positioned as topmost layer of the stack structure, and
the fourth chip is positioned as undermost layer of the stack structure.

(17)
The sensor device according to any one of (13) to (16), wherein
the sensor information represents image data,
the sensor includes
a light receiving unit having a plurality of photoelectric conversion elements, and
a signal processing circuit that reads image data from the light receiving unit, and
the first chip includes
a fifth chip having the light receiving unit installed thereon, and
a sixth chip having the signal processing circuit installed thereon.

(18)
An electronic device comprising:
a sensor that obtains sensor information;
an FPGA that performs predetermined processing on the sensor information obtained by the sensor; and
a memory that is used to store data, which is to be used in making the FPGA perform the predetermined processing.

(19)
A sensor system in which an electronic device and a server are connected via a predetermined network, wherein
the electronic device includes
a sensor that obtains sensor information,
an FPGA that performs predetermined processing on the sensor information obtained by the sensor,
a memory that is used to store data, which is to be used in making the FPGA perform the predetermined processing,
a sending unit that sends the sensor information, which has been subjected to the predetermined processing, to a predetermined network, and
a receiving unit that receives updating data, which is to be used in updating the FPGA and which is generated according to result of analysis of the sensor information sent to the predetermined network,
the server
analyzes the sensor information received from the electronic device via the predetermined network,
generates the updating data to be used in updating the FPGA according to result of analysis, and
sends the generated updating data to the predetermined network, and
the data stored in the memory is updated with the updating data received by the receiving unit via the predetermined network.

(20)
A control method comprising:
a step for analyzing sensor information obtained by a sensor; and
a step for modifying, according to result of analysis of the sensor information, at least either a circuit configuration of an FPGA which performs predetermined processing on the sensor information, or a setting value of the circuit configuration.

REFERENCE SIGNS LIST 1 sensor system
2 communication device
3 server
10, 20, 30, 40, 50, 60 image sensor
11 light receiving unit
12 high-speed signal processing circuit
13 flexible logic circuit
14 main processor
15 memory
16 driver
17 nonvolatile memory
18 transceiver unit
21 light receiving unit/high-speed signal processing circuit
32 signal processing circuit
41 light receiving unit/signal processing circuit
53 signal processing circuit/flexible logic circuit
61 DNN circuit
110 light receiving chip
111 optical sensor array
120 analog/logic chip
121 pixel circuit
122 ADC
123 CDS circuit
124 gain adjustment circuit
130 flexible logic chip
131 FPGA
132 logic circuit
140 processor chip
141 MPU
150 memory chip
151 memory area
152 programmable memory area
181 DAC
182 transmission antenna
183 ADC
184 receiving antenna
101 photoelectric conversion
201 AD/CDS processing
301 black level processing
302 defect correction
303 shading correction
304 distortion correction
401 control system correction
501 AE/AF/AWB
502 synchronization
503 linear matrix processing
504 gamma correction
505 luminance-color separation
506 edge reinforcement
507 color difference matrix processing
508 resizing/zooming
509 output I/F processing

The invention claimed is:
1. A sensor device comprising:
a sensor that obtains sensor information;
an FPGA (Field-Programmable Gate Array) that performs predetermined processing on the sensor information obtained by the sensor;
a memory that is used to store data, which is to be used in making the FPGA perform the predetermined processing, wherein the data stored in the memory is updated according to result of analysis of the sensor information;
a receiving unit that receives updating data; and
a counter for monitoring a repetition count of analysis of the sensor information, wherein
the repetition count is incremented each time the updating data is received, and the repetition count is reset if the incremented repetition count is greater than a predetermined upper limit value of the repetition count.

2. The sensor device according to claim 1, further comprising:
a sending unit that sends the sensor information, which has been subjected to the predetermined processing, to a predetermined network, wherein;
the updating data is to be used in updating the FPGA and is generated according to result of the analysis of the sensor information sent to the predetermined network, and
the data stored in the memory is updated with the updating data.

3. The sensor device according to claim 2, wherein
the sending unit sends the sensor information to a predetermined network using wireless communication, and
the receiving unit receives the updating data from the predetermined network using wireless communication.

4. The sensor device according to claim 3, further comprising:
an encoding unit that encodes the sensor information; and
a decoding unit that removes encoding of the updating data.

5. The sensor device according to claim 1, further comprising a processor that
analyzes the sensor information,
generates the updating data to be used in updating the FPGA according to result of analysis, and
updates the data, which is stored in the memory, with the generated updating data.

6. The sensor device according to claim 5, further comprising a DNN (Deep Neural Network) circuit that analyzes sensor information by performing machine learning, wherein
the processor analyzes the sensor information based on result of the machine learning performed by the DNN circuit.

7. The sensor device according to claim 1, further comprising:
a sending unit that sends the sensor information, which has been subjected to the predetermined processing, to a predetermined network;
a processor that analyzes the sensor information and generates the updating data to be used in updating the FPGA according to result of the analysis; and
a switching unit that switches between sending the sensor information to the predetermined network using the sending unit and inputting the sensor information to the processor, wherein
the updating data is to be used in updating the FPGA and is generated according to result of the analysis of the sensor information sent to the predetermined network, and
the data stored in the memory is updated either with the updating data received by the receiving unit or with the updating data generated by the processor.

8. The sensor device according to claim 1, wherein
the sensor information represents image data, and
the sensor includes
a light receiving unit having a plurality of photoelectric conversion elements, and
a signal processing circuit that reads image data from the light receiving unit.

9. The sensor device according to claim 8, wherein the predetermined processing includes at least one of black level processing, defect correction, shading correction, distortion correction, automatic exposure/automatic focusing/automatic white balance adjustment, synchronization, linear matrix processing, gamma correction, luminance-color separation, edge reinforcement, color difference matrix processing, or resizing/zooming.

10. The sensor device according to claim 1, wherein the data contains
circuit data to be used in incorporating a circuit configuration, which performs the predetermined processing, in the FPGA, and
setting data containing parameters to be set in the circuit configuration.

11. The sensor device according to claim 1, further comprising a processor that performs the predetermined processing in coordination with the FPGA.

12. A sensor device comprising:
a sensor that obtains sensor information;
an FPGA (Field-Programmable Gate Array) that performs predetermined processing on the sensor information obtained by the sensor;
a memory that is used to store data, which is to be used in making the FPGA perform the predetermined processing;
a first chip that has the sensor installed thereon;
a second chip that has the FPGA installed thereon; and
a third chip that has the memory installed thereon, wherein the sensor device has a stack structure formed by stacking the first chip to the third chip, and the third chip is positioned in between the first chip and the second chip.

13. The sensor device according to claim 12, further comprising a fourth chip that has a processor installed thereon for performing the predetermined processing in coordination with the FPGA, wherein
the stack structure is formed by stacking the first chip to the fourth chip.

14. The sensor device according to claim 13, wherein
the first chip is positioned as topmost layer of the stack structure, and
the fourth chip is positioned as undermost layer of the stack structure.

15. The sensor device according to claim 12, wherein
the sensor information represents image data,
the sensor includes
a light receiving unit having a plurality of photoelectric conversion elements, and
a signal processing circuit that reads image data from the light receiving unit, and the first chip includes
a fifth chip having the light receiving unit installed thereon, and
a sixth chip having the signal processing circuit installed thereon.

16. An electronic device comprising:
a sensor that obtains sensor information;
an FPGA that performs predetermined processing on the sensor information obtained by the sensor;
a memory that is used to store data, which is to be used in making the FPGA perform the predetermined processing, wherein the data stored in the memory is updated according to result of analysis of the sensor information;
a receiving unit that receives updating data; and
a counter for monitoring a repetition count of analysis of the sensor information, wherein the repetition count is incremented each time the updating data is received, and the repetition count is reset if the incremented repetition count is greater than a predetermined upper limit value of the repetition count.

17. A sensor system in which an electronic device and a server are connected via a predetermined network, wherein the electronic device includes
a sensor that obtains sensor information,
an FPGA that performs predetermined processing on the sensor information obtained by the sensor,
a memory that is used to store data, which is to be used in making the FPGA perform the predetermined processing,
a sending unit that sends the sensor information, which has been subjected to the predetermined processing, to a predetermined network,
a receiving unit that receives updating data, which is to be used in updating the FPGA and which is generated according to result of analysis of the sensor information sent to the predetermined network, and
a counter for monitoring a repetition count of analysis of the sensor information, wherein the repetition count is incremented each time the updating data is received, and the repetition count is reset if the incremented repetition count is greater than a predetermined upper limit value of the repetition count,
the server
analyzes the sensor information received from the electronic device via the predetermined network, generates the updating data to be used in updating the FPGA according to result of analysis, and
sends the generated updating data to the predetermined network, and
the data stored in the memory is updated with the updating data received by the receiving unit via the predetermined network.

18. A control method comprising:
analyzing sensor information obtained by a sensor;
monitoring a repetition count of analysis of the sensor information;
receiving updating data;
incrementing the repetition count each time the updating data is received;
resetting the repetition count if the incremented repetition count is greater than a predetermined upper limit value of the repetition count; and
modifying, according to result of the analysis of the sensor information, at least either a circuit configuration of an FPGA which performs predetermined processing on the sensor information, or a setting value of the circuit configuration.

* * * * *